(12) United States Patent
Wang et al.

(10) Patent No.: US 12,089,406 B2
(45) Date of Patent: Sep. 10, 2024

(54) THREE-DIMENSIONAL MEMORY DEVICE COMPRISING CONTACT PADS EXPOSED BY AN OPENING PASSING THROUGH LAYER STACK AND FABRICATION METHOD THEREOF

(71) Applicant: Yangtze Memory Technologies Co., Ltd., Wuhan (CN)

(72) Inventors: Yongqing Wang, Wuhan (CN); Siping Hu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 640 days.

(21) Appl. No.: 17/249,271

(22) Filed: Feb. 25, 2021

(65) Prior Publication Data

US 2022/0181351 A1  Jun. 9, 2022

Related U.S. Application Data

(63) Continuation of application No. PCT/CN2020/134864, filed on Dec. 9, 2020.

(51) Int. Cl.
*H10B 43/27* (2023.01)
*H01L 23/00* (2006.01)
(Continued)

(52) U.S. Cl.
CPC ............. *H10B 43/27* (2023.02); *H01L 24/06* (2013.01); *H10B 41/10* (2023.02); *H10B 41/27* (2023.02);
(Continued)

(58) Field of Classification Search
CPC ........ H10B 43/27; H10B 41/10; H10B 41/27; H10B 41/35; H10B 41/40; H01L 24/06
(Continued)

(56) References Cited

U.S. PATENT DOCUMENTS

2016/0079164 A1\* 3/2016 Fukuzumi ............. H01L 21/185
438/107
2019/0057756 A1 2/2019 Kim et al.
(Continued)

FOREIGN PATENT DOCUMENTS

| CN | 109155320 A | 1/2019 |
| CN | 110574162 | 12/2019 |

(Continued)

OTHER PUBLICATIONS

The World Intellectual Property Organization (WIPO) International Search Report for PCT/CN2020/134864 Sep. 6, 2021 4 pages.

*Primary Examiner* — Quoc D Hoang
(74) *Attorney, Agent, or Firm* — Anova Law Group, PLLC

(57) ABSTRACT

Three-dimensional (3D) NAND memory devices and methods are provided. In one aspect, a fabrication method includes providing a substrate, forming memory cells over the substrate, depositing a first dielectric layer to cover the memory cells, forming at least one contact pad over the substrate, depositing a second dielectric layer over the at least one contact pad, forming first connecting pads over the second dielectric layer, bonding the first connecting pads with second connecting pads of a peripheral structure, and exposing the at least one contact pad from a back side of the substrate.

16 Claims, 17 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC .............. *H10B 41/35* (2023.02); *H10B 41/40* (2023.02); *H10B 43/10* (2023.02); *H10B 43/35* (2023.02); *H10B 43/40* (2023.02)

(58) Field of Classification Search
USPC ........................................................ 257/314
See application file for complete search history.

(56) References Cited

U.S. PATENT DOCUMENTS

| 2020/0058669 A1 | 2/2020 | Chen et al. |
| 2020/0286905 A1 | 9/2020 | Kai et al. |

FOREIGN PATENT DOCUMENTS

| CN | 111566816    | 8/2020 |
| CN | 111937148 A  | 11/2020 |
| CN | 111971795 A  | 11/2020 |
| JP | 201422729 A  | 2/2014 |
| JP | 2016062901 A | 4/2016 |
| JP | 2020510312 A | 4/2020 |
| KR | 20200008157 A| 1/2020 |
| WO | 2020034152 A1| 2/2020 |

* cited by examiner

THREE-DIMENSIONAL MEMORY DEVICE COMPRISING CONTACT PADS EXPOSED BY AN OPENING PASSING THROUGH LAYER STACK AND FABRICATION METHOD THEREOF

CROSS-REFERENCE TO RELATED APPLICATION

This application claims the priority to PCT Patent Application No. PCT/CN2020/134864 filed on Dec. 9, 2020, the entire content of which is incorporated herein by reference.

FIELD OF THE TECHNOLOGY

This application relates to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

When contact pads of a 3D NAND structure are fabricated, a metal layer is deposited and plasma processing is often used during the process. Plasma processing can generate plasma-induced damage (PID) to complementary-metal-oxide-semiconductor (CMOS) circuits. For example, an unintended high electric field can develop stresses and degrade the gate-oxide in a metal-oxide-silicon (MOS) transistor during plasma processing. In addition, the insulator of a metal-insulator-metal (MIM) capacitor can also be degraded or damaged. The disclosed devices and methods are directed to solve one or more problems set forth above and other problems.

SUMMARY

In one aspect of the present disclosure, a fabrication method for a 3D memory device includes providing a substrate for the 3D memory device, forming memory cells of the 3D memory device over a first portion of a face side of the substrate, depositing a first dielectric layer to cover the memory cells and the substrate, forming at least one contact pad over a second portion of the face side of the substrate, depositing a second dielectric layer over the at least one contact pad and the first dielectric layer, forming first connecting pads over the second dielectric layer and connected to the at least one contact pad and the memory cells, bonding the first connecting pads with second connecting pads of a peripheral structure, and exposing the at least one contact pad from a back side of the substrate.

In another aspect of the present disclosure, a 3D memory device includes an array device, a peripheral device, and an opening. The array device and the peripheral device are bonded face to face. The array device includes an insulating layer, one or more contact pads, and memory cells between a first portion of the insulating layer and the peripheral device. The opening is formed through a second portion of the insulating layer and exposes the one or more contact pads disposed at a bottom of the opening from a back side of the array device. The bottom of the opening is disposed at a level between the insulating layer and the peripheral device.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

FIGS. 1-13 schematically show fabrication processes of an exemplary 3D array device 100 according to embodiments of the present disclosure. The 3D array device 100 is a part of a memory device and may also be referred to as a 3D memory structure. Among the figures, top views are in an X-Y plane and cross-sectional views are in a Y-Z plane.

Figure 1:
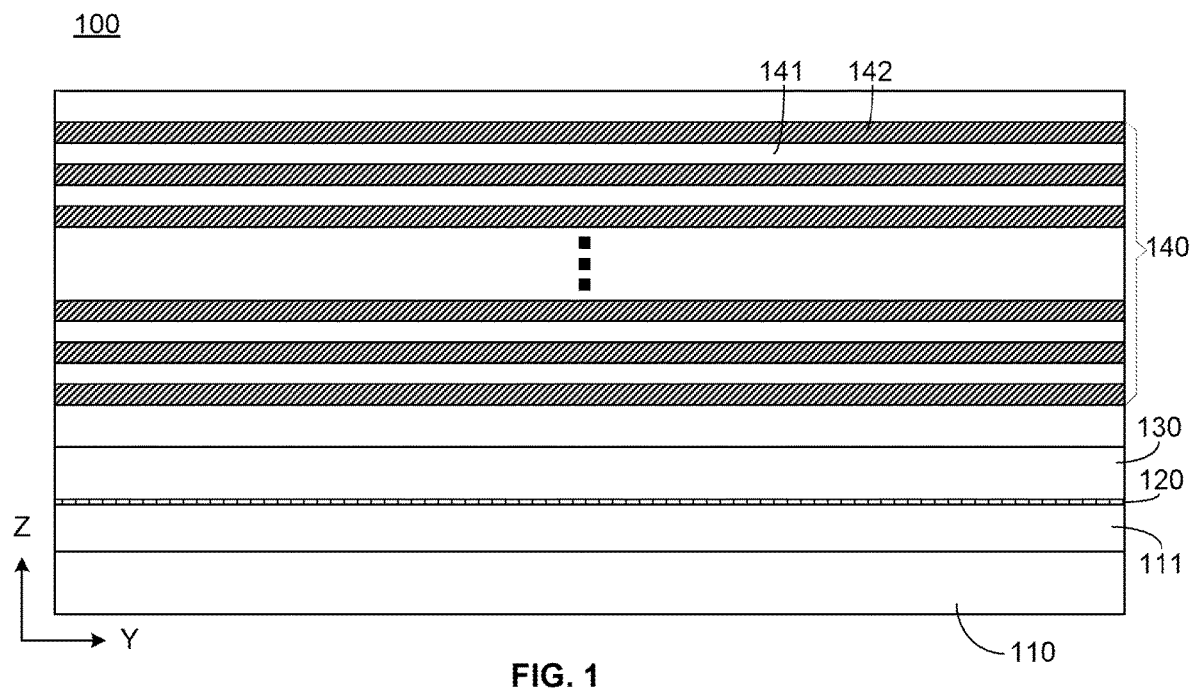
FIGS. 1 and 2 illustrate cross-sectional views of an exemplary three-dimensional (3D) array device at certain stages during a fabrication process according to various embodiments of the present disclosure.

As shown in a cross-sectional view in FIG. 1, the 3D array device 100 may include a substrate 110. In some embodiments, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polycrystalline silicon (polysilicon), or a Group III-V compound such as gallium arsenide (GaAs) or indium phosphide (InP). The substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some embodiments, a top portion of the substrate 110 may be doped by n-type dopants via ion implantation and/or diffusion to become a doped region 111. The dopants of the doped region 111 may include, for example, phosphorus (P), arsenic (As), and/or antimony (Sb). As shown in FIG. 1, a cover layer 120 may be deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other embodiments, the cover layer 120 may include another material such as aluminum oxide.

Further, over the cover layer 120, a sacrificial layer 130 may be deposited. The sacrificial layer 130 may include a dielectric material, a semiconductor material, or a conductive material. An exemplary material for the sacrificial layer 130 is polysilicon.

After the polysilicon sacrificial layer 130 is deposited, a layer stack 140 may be formed. The layer stack 140 includes multiple pairs of stack layers, for example, including first dielectric layers 141 and second dielectric layers 142, stacked alternately over each other. The layer stack may include 64 pairs, 128 pairs, or more than 128 pairs of the first and second dielectric layers 141 and 142.

In some embodiments, the first dielectric layers 141 and the second dielectric layers 142 may be made of different materials. For example, the different materials may include silicon oxide and silicon nitride. In descriptions below, the first dielectric layer 141 may include a silicon oxide layer exemplarily, which may be used as an isolation stack layer, while the second dielectric layer 142 may include a silicon nitride layer exemplarily, which may be used as a sacrificial stack layer. The sacrificial stack layer may be subsequently etched out and replaced by a conductor layer. The first dielectric layers 141 and the second dielectric layers 142 may be deposited via CVD, PVD, ALD, or a combination thereof.

Figure 2:
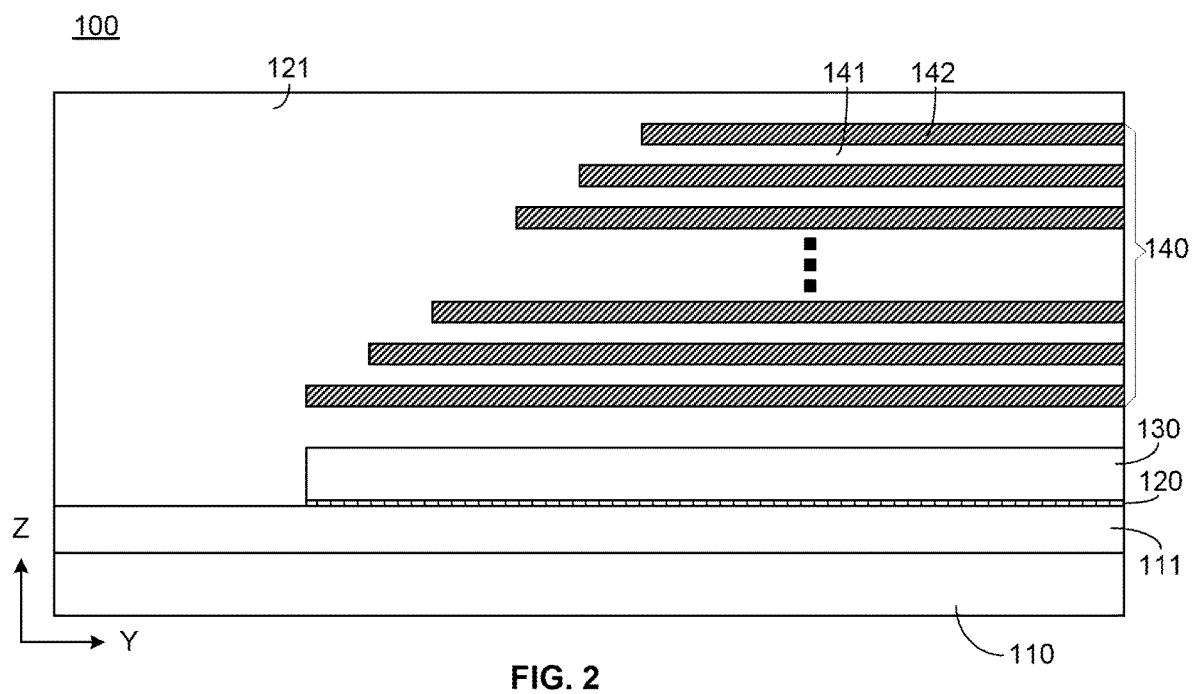

FIG. 2 shows a schematic cross-sectional view of the 3D array device 100 according to embodiments of the present disclosure. As shown in FIG. 2, after the layer stack 140 is formed, a staircase formation process may be performed to trim a part of the layer stack 140 into a staircase structure. Any suitable etching processes, including dry etch and/or wet etch processes, may be used in the staircase formation process. For example, the height of the staircase structure may increase in a stepwise manner along the Y direction. A dielectric layer 121 may be deposited to cover the staircase structure. As shown in FIG. 2, the layer stack 140, the sacrificial layer 130, and the cover layer 120 may be removed in a region on a side of the staircase structure, e.g., on the left side of the staircase structure. The region may be viewed as a contact region where contact pads may be configured. The contact region is covered by the dielectric layer 121 during the staircase formation process. In some embodiments, the cover layer 120 may not be etched away in the staircase formation process and a portion of the cover layer 120 may be buried by the dielectric 121 in the contact region.

Figure 3:
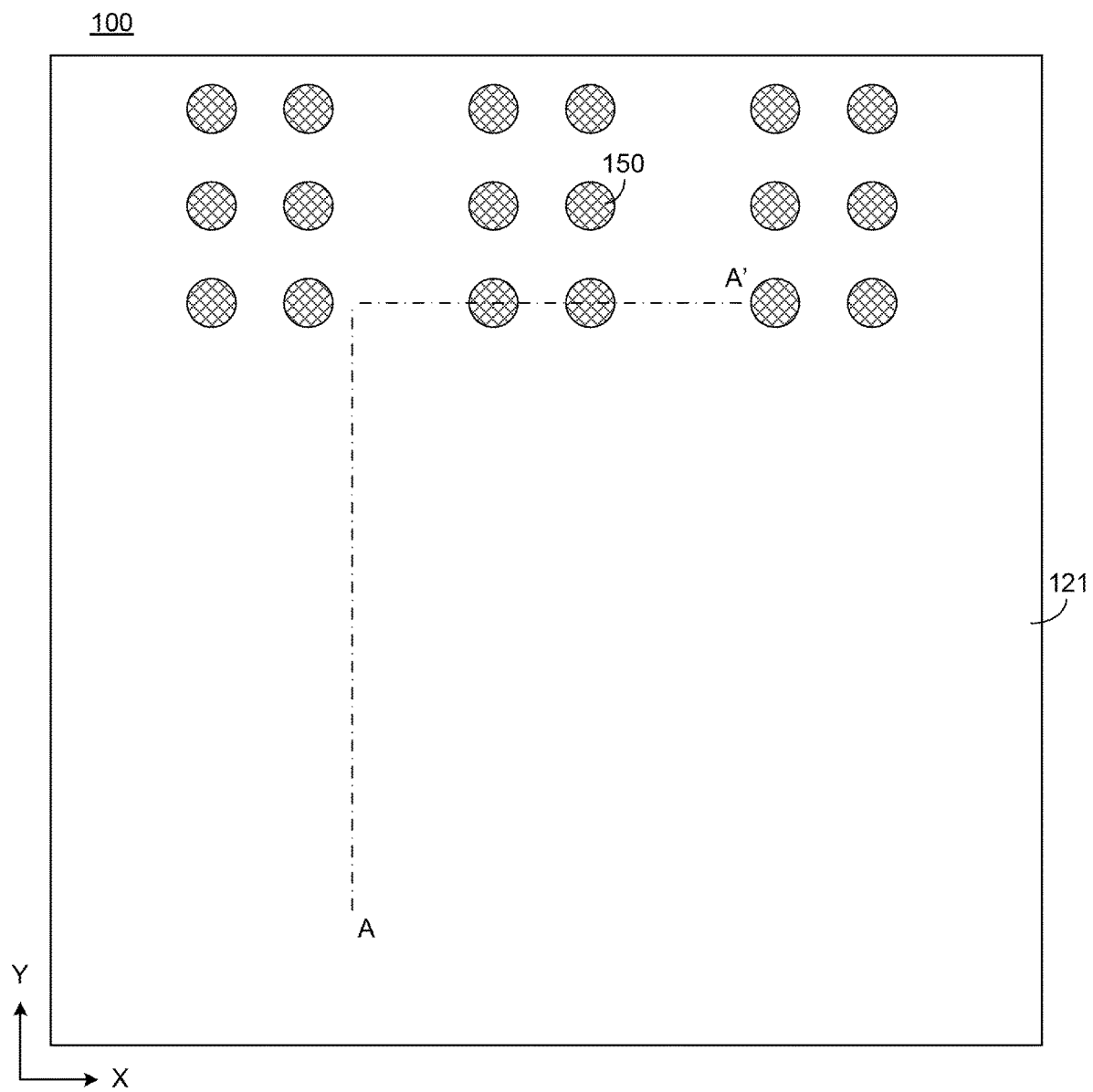
FIGS. 3 and 4 illustrate a top view and a cross-sectional view of the 3D array device shown in FIG. 2 after channel holes are formed according to various embodiments of the present disclosure.
Figure 4:
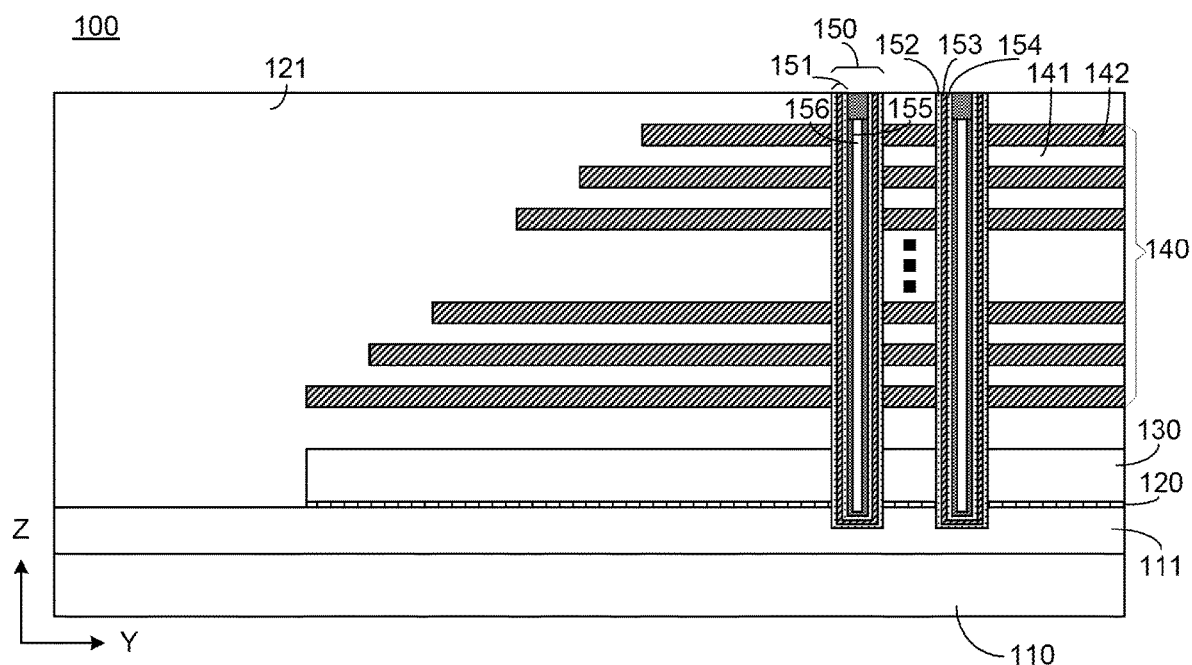

FIGS. 3 and 4 show a schematic top view and a schematic cross-sectional view of the 3D array device 100 after channel holes 150 are formed and then filled with layer structures according to embodiments of the present disclosure. The cross-sectional view shown in FIG. 4 is taken along a line AA' of FIG. 3. The quantity, dimension, and arrangement of the channel holes 150 shown in FIGS. 3 and 4 and in other figures in the present disclosure are exemplary and for description purposes, although any suitable quantity, dimension, and arrangement may be used for the disclosed 3D array device 100 according to various embodiments of the present disclosure.

As shown in FIGS. 3 and 4, the channel holes 150 are arranged to extend in the Z direction or in a direction approximately perpendicular to the substrate 110 and form an array of a predetermined pattern (not shown) in the X-Y plane. The channel holes 150 may be formed by, for example, a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer 130, the cover layer 120, and partially penetrates the doped region 111. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trap layer 153 on a surface of the blocking layer 152 to store charges during an operation of the 3D array device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, or another wide bandgap material. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, or another wide bandgap material.

In some embodiments, the functional layer 151 may include an oxide-nitride-oxide (ONO) structure. Optionally, the functional layer 151 may have a structure different from the ONO configuration. When the ONO structure is used exemplarily in descriptions below, the functional layer 151 may include a silicon oxide layer, a silicon nitride layer, and another silicon oxide layer. That is, the blocking layer 152 may be a silicon oxide layer deposited on the sidewall of the channel hole 150, the charge trap layer 153 may be a silicon nitride layer deposited on the blocking layer 152, and the tunnel insulation layer 154 may be another silicon oxide layer deposited on the charge trap layer 153.

Further, a channel layer 155 may be deposited on the tunnel insulation layer 154. The channel layer 155 is also referred to as a "semiconductor channel" and may include polysilicon in some embodiments. Alternatively, the channel layer 155 may include amorphous silicon. Like the channel holes, the channel layer 155 also extends through the layer stack 140 and into the doped region 111. The blocking layer 152, the charge trap layer 153, the tunnel insulation layer 154, and the channel layer 155 may be deposited by, e.g., CVD, PVD, ALD, or a combination of two or more of these processes. The channel hole 150 may be filled by an oxide material 156 after the channel layer 155 is formed. The functional layer 151 and channel layer 155 formed in a channel hole 150 may be considered as a channel hole structure.

In the process described above, the channel holes 150 are etched after the staircase structure is formed. The channel holes 150 may also be formed before the staircase formation process. For example, after the layer stack 140 is fabricated as shown in FIG. 1, the channel holes 150 may be formed and then the functional layer 151 and the channel layer 155 may be deposited. After the channel holes 150 are filled with the oxide material 156, the staircase formation process may be performed to form the staircase structure.

Figure 5:
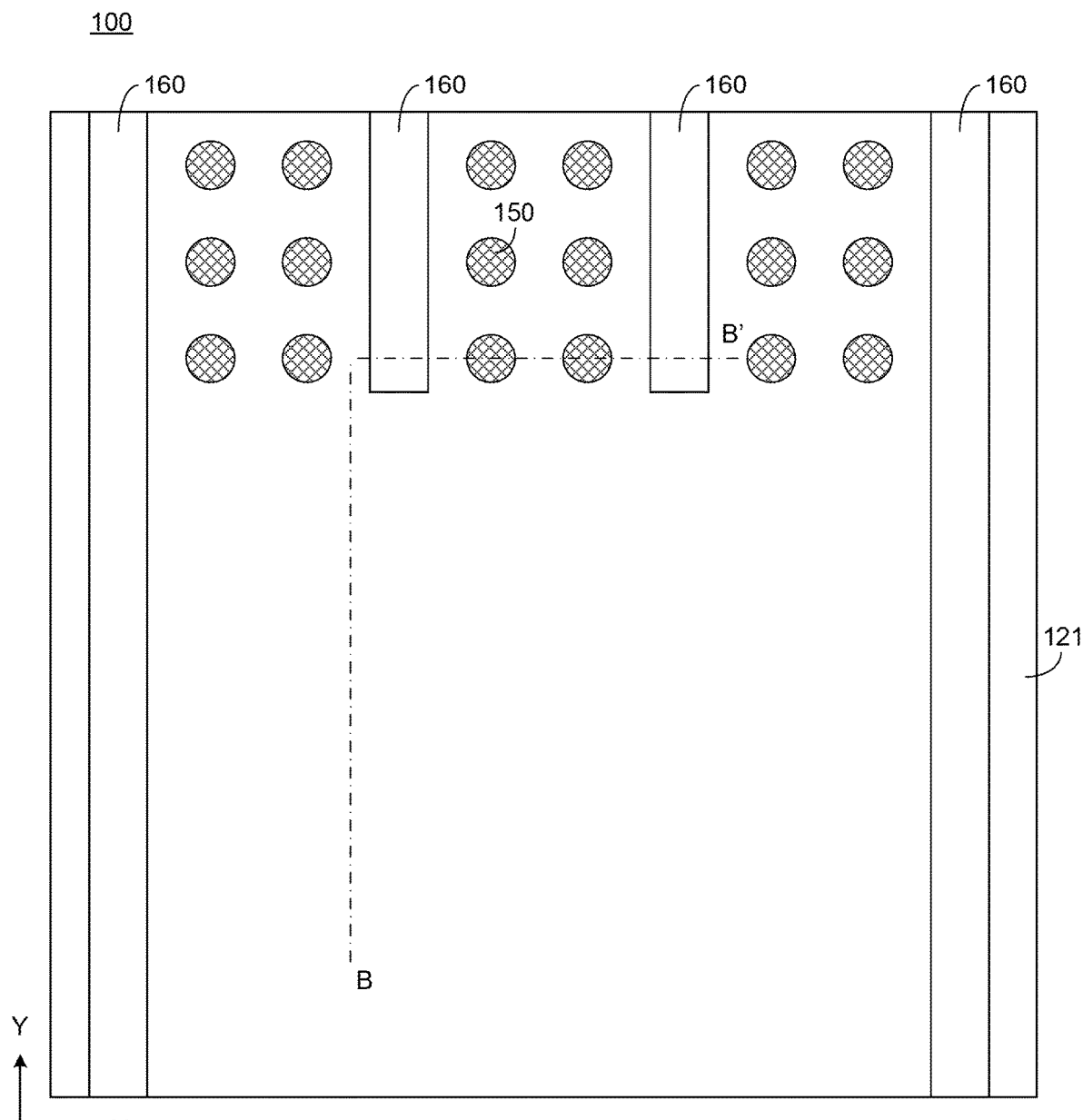
FIGS. 5 and 6 illustrate a top view and a cross-sectional view of the 3D array device shown in FIGS. 3 and 4 after gate line slits are formed according to various embodiments of the present disclosure.
Figure 6:
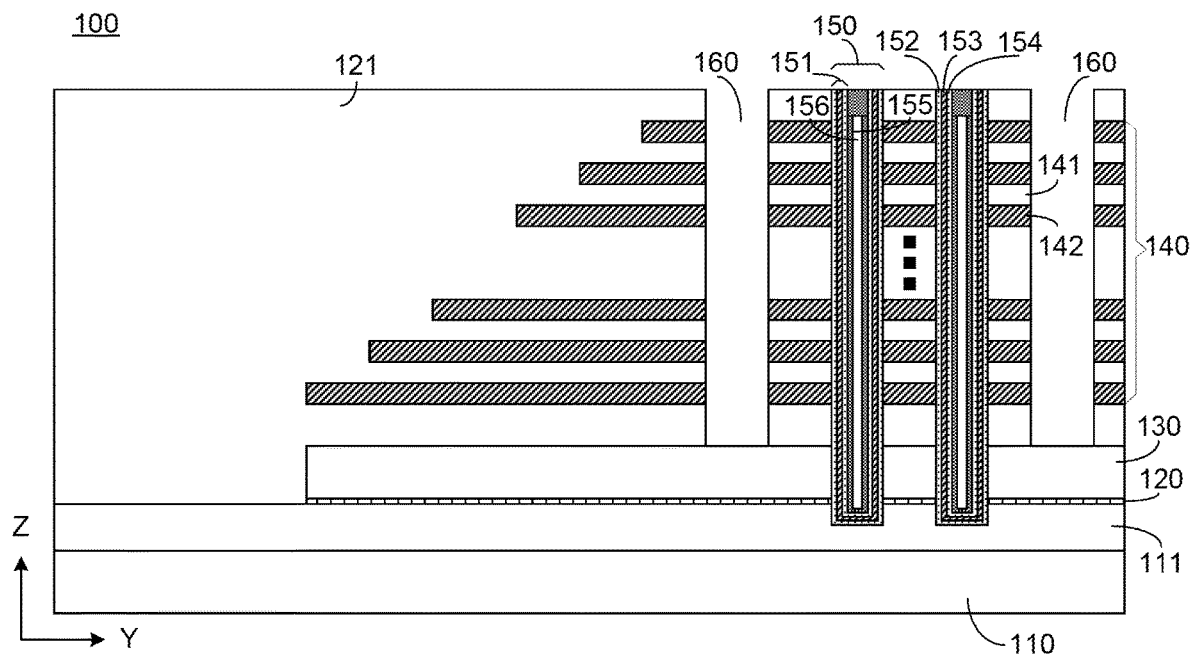

FIGS. 5 and 6 show a schematic top view and a schematic cross-sectional view of the 3D array device 100 after gate line slits 160 are formed according to embodiments of the present disclosure. The cross-sectional view shown in FIG. 6 is taken along a line BB' of FIG. 5. A gate line slit may also be referred to as a gate line slit structure. The 3D array device 100 may have a great number of channel holes 150 arranged in memory planes (not shown). Each memory plane may be divided into memory blocks (not shown) and memory fingers by the gate line slits. For example, the configuration of the channel holes 150 as shown in FIG. 5 may reflect memory fingers among the gate line slits 160.

The gate line slits 160 may be formed by, e.g., a dry etch process or a combination of dry and wet etch processes. As shown in FIGS. 5 and 6, the gate line slits 160 may extend, e.g., in the X direction horizontally, and extend through the layer stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD, PVD, ALD, or a combination of two or more of these processes. The spacer layers are configured to protect the first and second dielectric layers 141 and 142 and may include, for example, silicon oxide and silicon nitride.

After the spacer layers are deposited, selective etching may be performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, may be performed to remove the sacrificial layer 130. Removal of the sacrificial layer 130 creates a cavity and exposes the cover layer 120 and bottom portions of the blocking layers 152 formed in the channel holes 150. Further, multiple selective etch processes, e.g., multiple selective wet etch processes, may be performed to remove the exposed portions of the blocking layer 152, the charge trap layer 153, and the tunnel insulation layer 154 consecutively, which exposes bottom side potions of the channel layer 155.

When the cover layer 120 is silicon oxide and/or silicon nitride, the cover layer 120 may be removed when the bottom portions of the functional layers 151 are etched away. In certain embodiments, the cover layer 120 may include a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the channel layers 155 close to the bottom of the channel hole 150 may be exposed in the cavity left by etching away the sacrificial layer 130 and the cover layer 120. The cavity may be filled by a semiconductor material, e.g., polysilicon, to form a semiconductor layer 131, e.g., by a CVD and/or PVD deposition process. The semiconductor layer 131 may be n-doped, formed on the exposed surface of the doped region 111 and on sidewalls or side portions of the channel layers 155, and electrically connected to the doped region 111 and the channel layers 155.

Optionally, a selective epitaxial growth may be performed such that a layer of single crystalline silicon may be grown on the exposed surface of the doped region 111 and a polysilicon layer may be grown on the exposed surface of the channel layer 155. Thus, the semiconductor layer 131 may include adjoined layers of single crystalline silicon and polysilicon.

Figure 7:
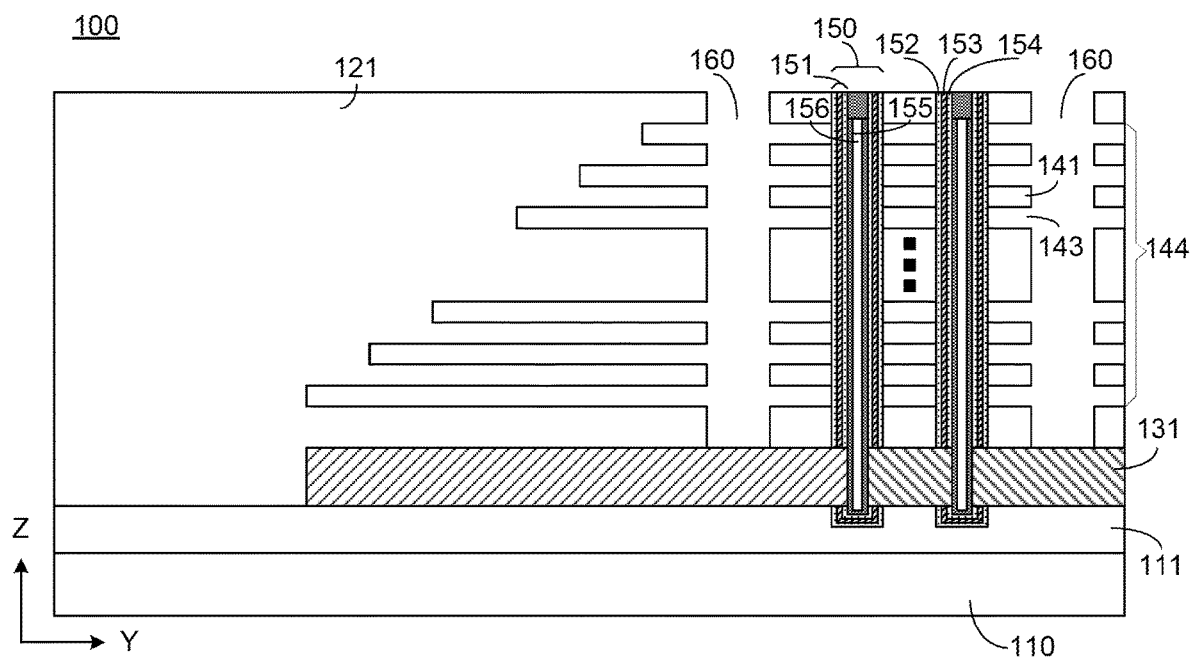
FIGS. 7, 8, and 9 illustrate cross-sectional views of the 3D array device shown in FIGS. 5 and 6 at certain stages in the fabrication process according to various embodiments of the present disclosure.

When the bottom parts of the functional layer 151 and the cover layer 120 are etched, some spacer layers may be etched away and the rest spacer layers may remain on the sidewall of the gate line slits 160 to protect the first and second dielectric layers 141 and 142. After the semiconductor layer 131 is formed, the remaining spacer layers may be removed in a selective etch process, e.g., a selective wet etch process, which exposes the sides of the second dielectric layer 142 around the gate line slits 160. In some embodiments, the innermost spacer layer, which is in contact with the sidewall, is silicon nitride. Because the second dielectric layers 142 are also silicon nitride layers, the innermost spacer layer and the second dielectric layers 142 may be removed together during the etch process, leaving cavities 143 between the first dielectric layers 141, as shown in FIG. 7. As such, the layer stack 140 is changed into a layer stack 144.

Figure 8:
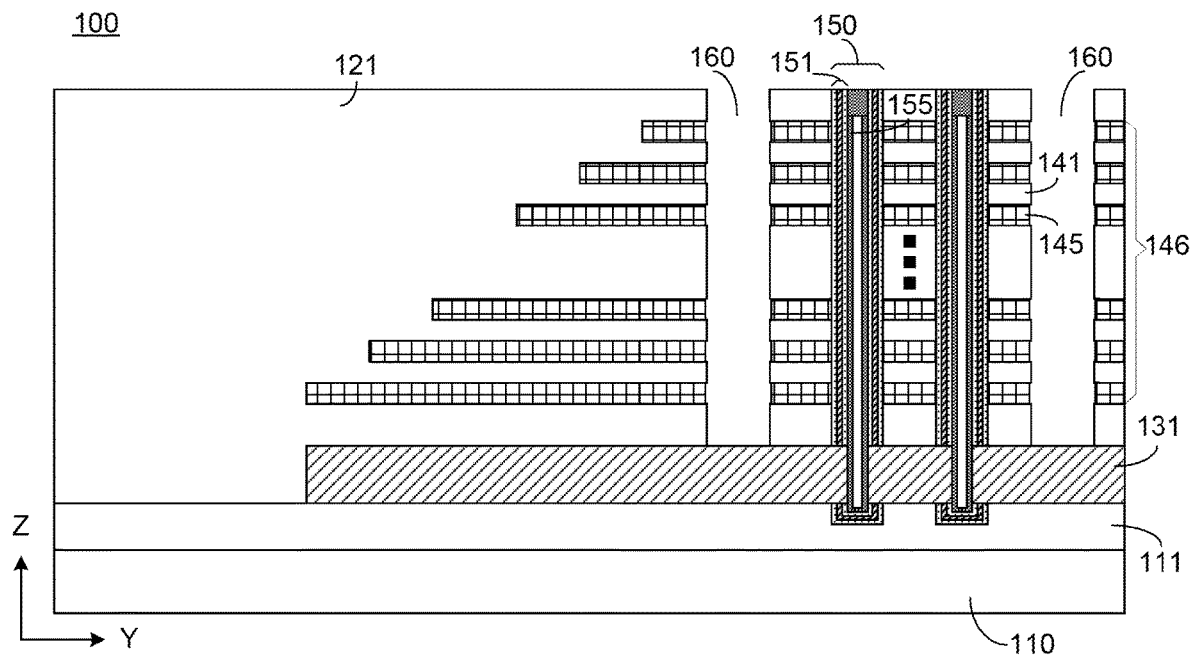

Further, an electrically conductive material such as tungsten (W) may be grown to fill the cavities 143 left by the removal of the second dielectric layers 142, forming conductor layers 145 between the first dielectric layers 141. After the conductor layers 145 are fabricated, the layer stack 144 is converted to a layer tack 146, as shown in FIG. 8. The layer stack 146 includes the first dielectric layers 141 and the conductor layers 145 that are alternatingly stacked over each other. The functional layer 151 and channel layer 155 in the channel hole 150 may be considered as a channel structure. Each channel structure, as shown in FIG. 8, extends through the layer stack 146 and the conductor layers 145 and into the doped region 111. In some embodiments, before metal W is deposited in the cavities 143, a dielectric layer (not shown) of a high-k dielectric material such as aluminum oxide may be deposited, followed by deposition of a layer of an electrically conductive material such as titanium nitride (TiN) (not shown). Further, metal W may be deposited to form the conductor layers 145. CVD, PVD, ALD, or a combination of two or more of these processes may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductor layers 145.

Referring to FIG. 8, a portion of each functional layer 151 in a channel hole 150 is between a portion of one of the conductor layers 145 and a portion of a channel layer 155 in the channel hole 150. Each conductor layer 145 is configured to electrically connect rows of NAND memory cells in an X-Y plane and is configured as a word line for the 3D array device 100. The channel layer 155 formed in the channel hole 150 is configured to electrically connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductor layer 145 and a channel layer 155, i.e., between a word line and a bit line. The functional layer 151 may also be considered as disposed between the channel layer 155 and the layer stack 146. A portion of the conductor layer 145 that is around a portion of the channel hole 150 functions as a control gate or gate electrode for a NAND memory cell. The 3D array device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells.

For the substrate 110, the bottom side may also be referred to as the back side, and the top side, i.e., the side with the doped region 111, may be referred to as the front side or face side. As shown in FIG. 8, the NAND memory cells are formed over a portion of the face side of the substrate 110.

Figure 9:
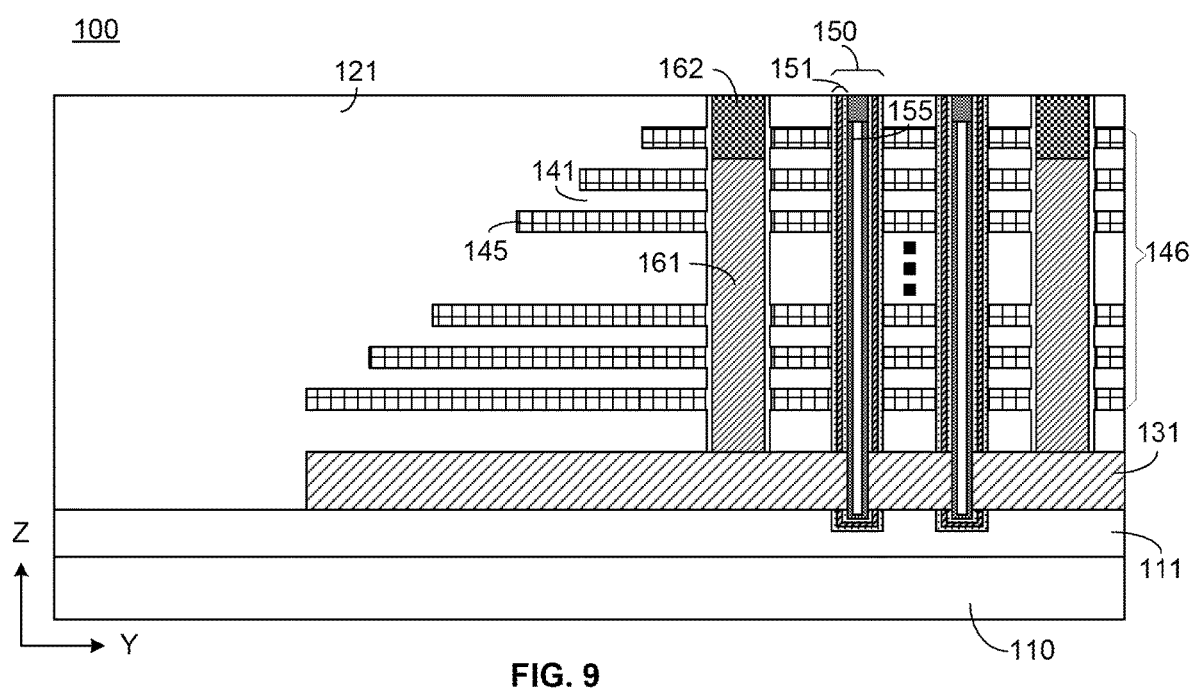

After the conductor layers 145 are grown in the cavities 143, a dielectric layer (e.g., a silicon oxide layer) may be deposited on the sidewalls and bottom surfaces of the gate line slits 160 by CVD, PVD, ALD, or a combination thereof. A dry etch process or a combination of dry etch and wet etch processes may be performed to remove the dielectric layer at the bottom of the gate line slits to expose parts of the semiconductor layer 131. The gate line slits may be filled with a conductive material 161 (e.g., doped polysilicon) and a conductive plug 162 (e.g., metal W). The conductive material 161 in the gate line slit may extend through the layer stack 146 and electrically contact the semiconductor layer 131, as shown in FIG. 9. The filled gate line slits may become an array common source for the 3D array device 100. In some embodiments, forming the array common source in the gate line slits may include depositing an insulation layer, a conductive layer (such as TiN, W, Co, Cu, or Al), and then a conductive material such as doped polysilicon. Optionally, some gate line slits may be filled with a dielectric material. In these cases, some other gate line slits may be filled with a conductive material to work as the array common source.

FIGS. 10-13 show schematic cross-sectional views of the 3D array device 100 at certain stages after contacts and vias are formed according to embodiments of the present disclosure. After the gate line slits 160 are filled and the array common source is formed, openings for word line contacts 171 may be formed by, e.g., a dry etch process or a combination of dry and wet etch processes, to create interconnects for the 3D array device 100. The openings for the contacts 171 are then filled with a conductive material by CVD, PVD, ALD, electroplating, electroless plating, or any combination thereof. The conductive material for the contacts 171 may include W, Co, Cu, Al, or a combination thereof. Optionally, a layer of a conductive material (e.g., TiN) may be deposited as a contact layer before another conductive material is deposited when the contacts 171 are fabricated.

Figure 10:
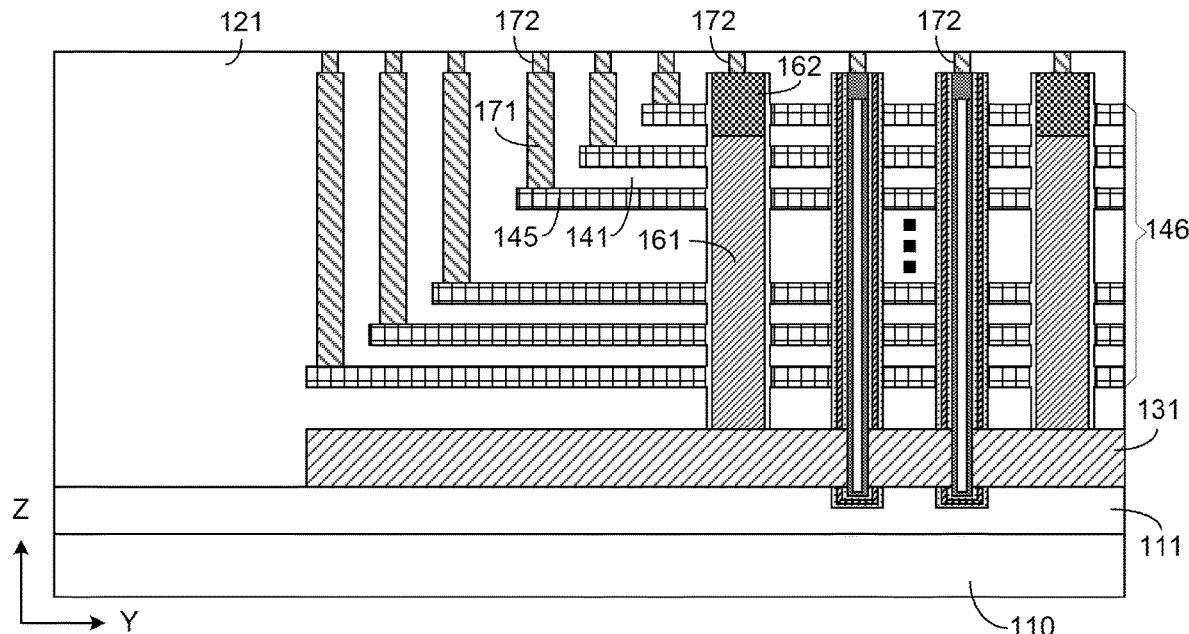
FIGS. 10, 11, 12, and 13 illustrate cross-sectional views of the 3D array device shown in FIG. 9 at certain stages in the fabrication process according to various embodiments of the present disclosure.

Further, a CVD or PVD process may be performed to deposit a dielectric material (e.g., silicon oxide or silicon nitride) to form a dielectric layer that covers the substrate 110, the contacts 171, and the NAND memory cells. The newly deposited dielectric layer is added to the dielectric layer 121 and thus the dielectric layer 121 becomes thicker. Openings for vias 172 may be formed by a dry etch process or a combination of dry and wet etch processes. The openings may be subsequently filled with a conductive material such as W, Co, Cu, Al, or a combination thereof to form vias 172, as shown in FIG. 10. CVD, PVD, ALD, electroplating, electroless plating, or a combination thereof may be performed. The vias 172 may be electrically connected to the word line contacts 171, the upper ends of corresponding NAND strings, and the plugs 162 of the array common source. Optionally, a layer of a conductive material (e.g., TiN) may be deposited first before filling the openings to form the vias 172.

Further, metal layers 173 and 174 for interconnect may be grown by CVD, PVD, ALD, electroplating, electroless plating, or a combination thereof. The metal layers 173 are deposited over and electrically contact the vias 172, respectively. The metal layers 174 are interconnects for the contact pads and located in the contact region on the side of the staircase structure. The metal layers 173 and 174 may include a conductive material such as W, Co, Cu, Al, or a combination thereof.

Figure 11:
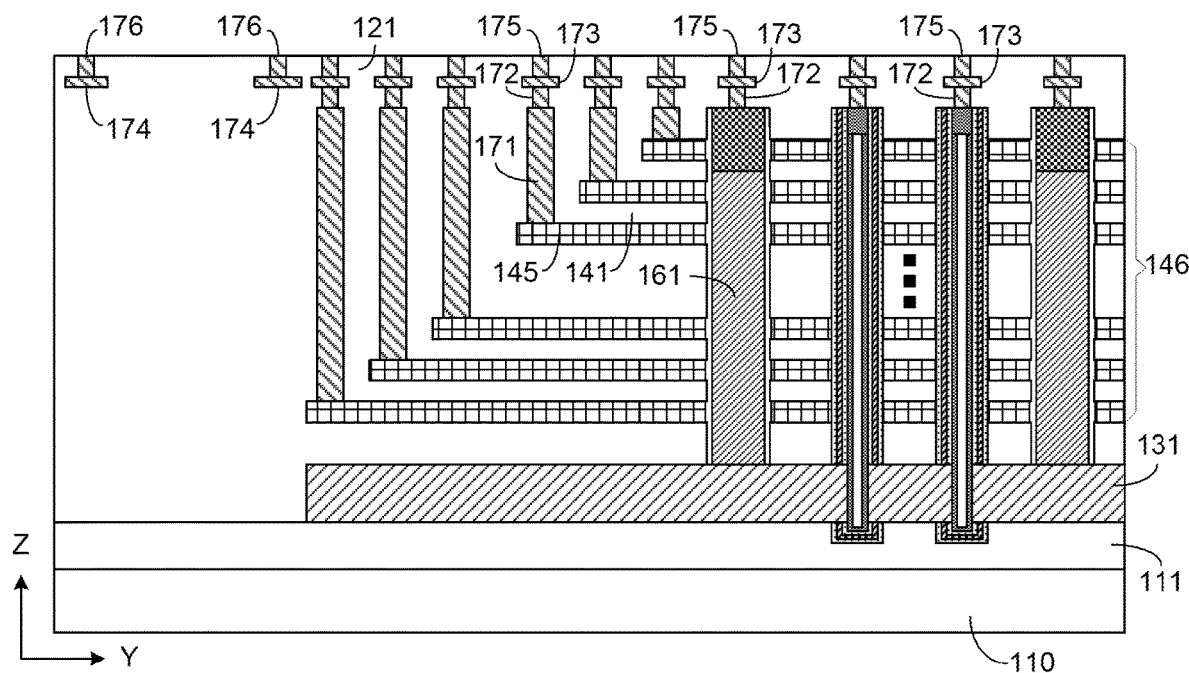

Similar to the formation of the vias 172, vias 175 and 176 may be made over the metal layers 173 and 174. For example, a dielectric material may be deposited to cover the metal layers 173 and 174 and make the dielectric layer 121 thicker, openings for vias 175 and 176 may be formed, and the openings may be subsequently filled with a conductive material to form the vias 175 and 176, as shown in FIG. 11.

Figure 12:
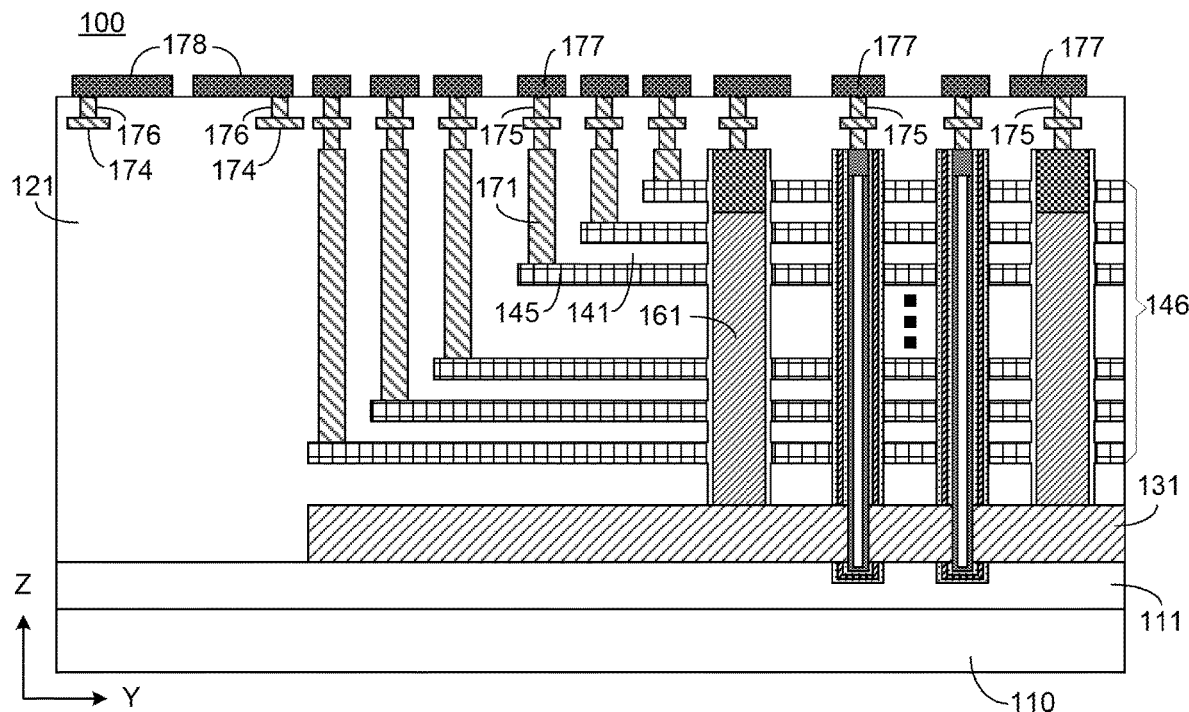

Now referring to FIG. 12, CVD, PVD, ALD, electroplating, electroless plating, or a combination thereof may be performed to grow metal layers 177 and 178 over the vias 175 and 176, respectively. Optionally, a single metal layer 178 (not shown), instead of multiple metal layers 178, may be made over the vias 176. In descriptions below, multiple metal layers 178 are used exemplarily. As shown in FIG. 12, while the NAND memory cells are formed over a portion of the face side of the substrate 110, the metal layers 178 are formed over another portion of the face side of the substrate 110. The metal layers 177 and 178 may be formed with the same material simultaneously, and formed approximately on the same level with respect to the doped region 111 and the substrate 110. As used herein, a level indicates an X-Y plane along the Z axis. A level of the metal layer 178 indicates an X-Y plane that passes through the metal layer 178. The height of a level, i.e., the height of an X-Y plane at the level, is measured against the Z axis. The metal layers 177 and 178 may include a conductive material such as W, Co, Cu, Al, or any combination thereof. The metal layers 177 are electrically connected to the layer stack 146 or the NAND memory cells through the metal layers 173 and the vias 175. The metal layers 178 are configured as the contact pads and connected to the metal layers 174 through vias 176.

Figure 13:
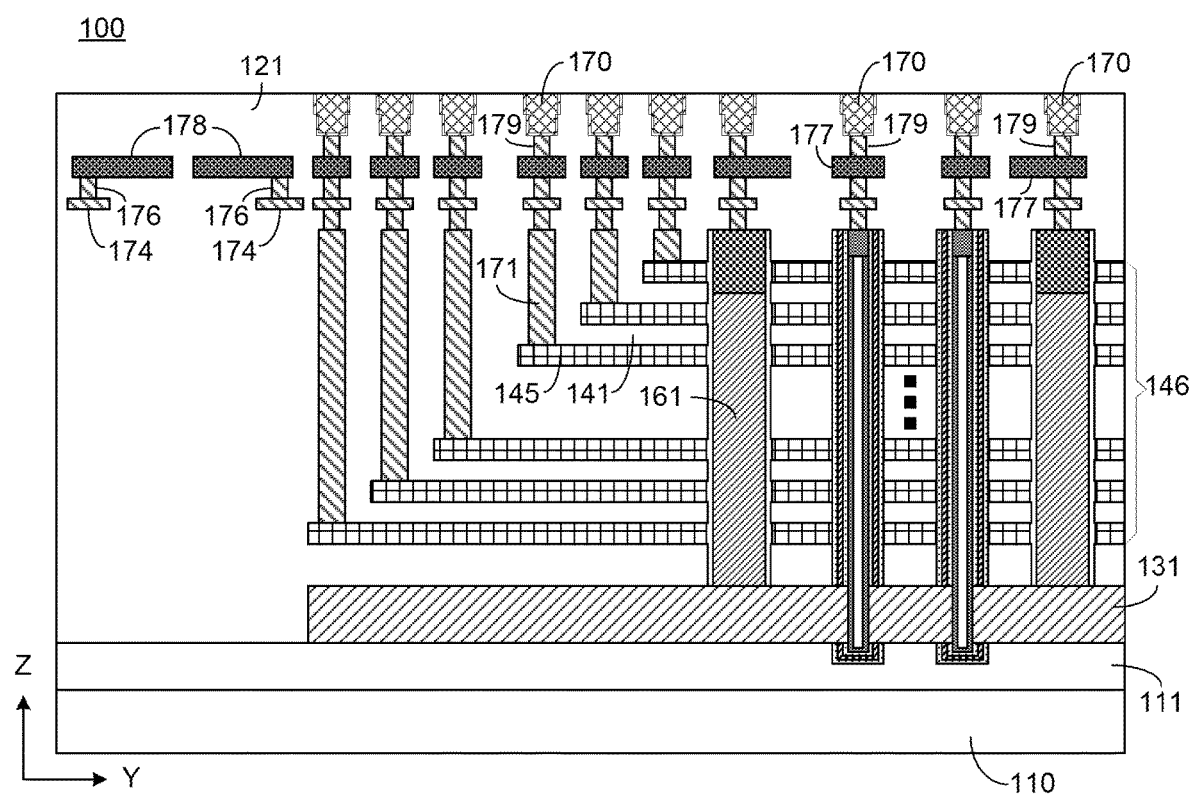

Further, a CVD or PVD process may be performed again to deposit a dielectric material (e.g., silicon oxide or silicon nitride) to form a dielectric layer that covers the metal layers 177 and 178 and further thickens the dielectric layer 121. Similar to the formation of vias 172 and 175, openings may be formed and then filled by a conductive material to form vias 179. The vias 179 are deposited over and electrically connected to the metal layers 177. Further, a dielectric material may be deposited to bury the vias 179 and further thicken the dielectric layer 121. Openings may be made and then filled to form connecting contacts 170 that serve as interconnects with a peripheral device. As shown in FIG. 13, the connecting pads 170 are electrically connected to the metal layers 177 through vias 179, respectively. The connecting pads 170 may include W, Co, Cu, Al, or a combination of two or more of these materials. Optionally, a contact layer of a conductive material (e.g., TiN) may be deposited first before filling the openings to form the connecting pads 170.

Figure 14:
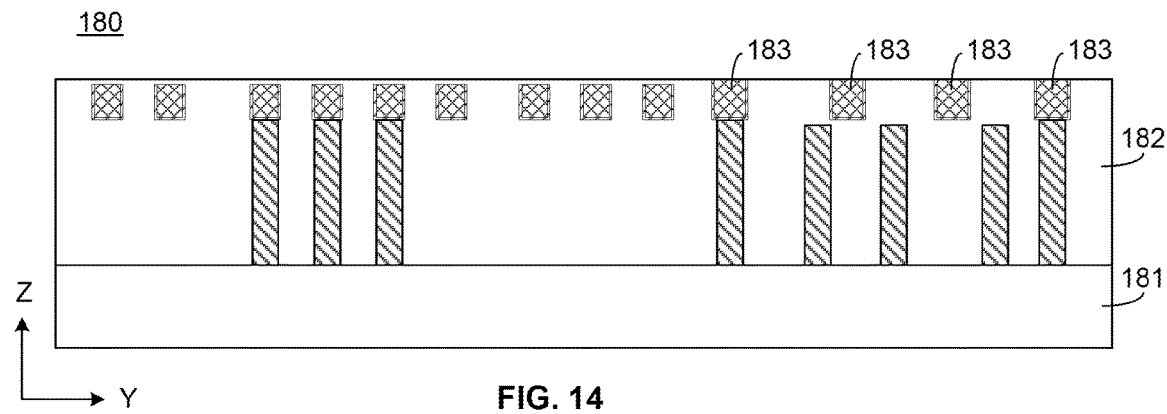
FIG. 14 illustrates a cross-sectional view of an exemplary peripheral device according to various embodiments of the present disclosure.

FIG. 14 shows a schematic cross-sectional view of a peripheral device 180 according to embodiments of the present disclosure. The peripheral device 180 is a part of a memory device and may also be referred to as a peripheral structure. The peripheral device 180 may include a substrate 181 that may include single crystalline silicon, Ge, SiGe, SiC, SOI, GOI, polysilicon, or a Group III-V compound such as GaAs or InP. Peripheral CMOS circuits (e.g., control circuits) (not shown) may be fabricated on the substrate 181 and used for facilitating the operation of the memory device. For example, the peripheral CMOS circuits may include metal-oxide-semiconductor field-effect transistors (MOSFETs) and provide functional devices such as page buffers, sense amplifiers, column decoders, and row decoders. A dielectric layer 182 may be deposited over the substrate 181 and the CMOS circuits. Connecting pads such as connecting pads 183 and vias may be formed in the dielectric layer 182. The dielectric layer 182 may include one or more dielectric materials such as silicon oxide and silicon nitride. The connecting pads 183 are configured as interconnects with the 3D array device 100 and may include an electrically conductive material such as W, Co, Cu, Al, or a combination thereof.

Figure 15:
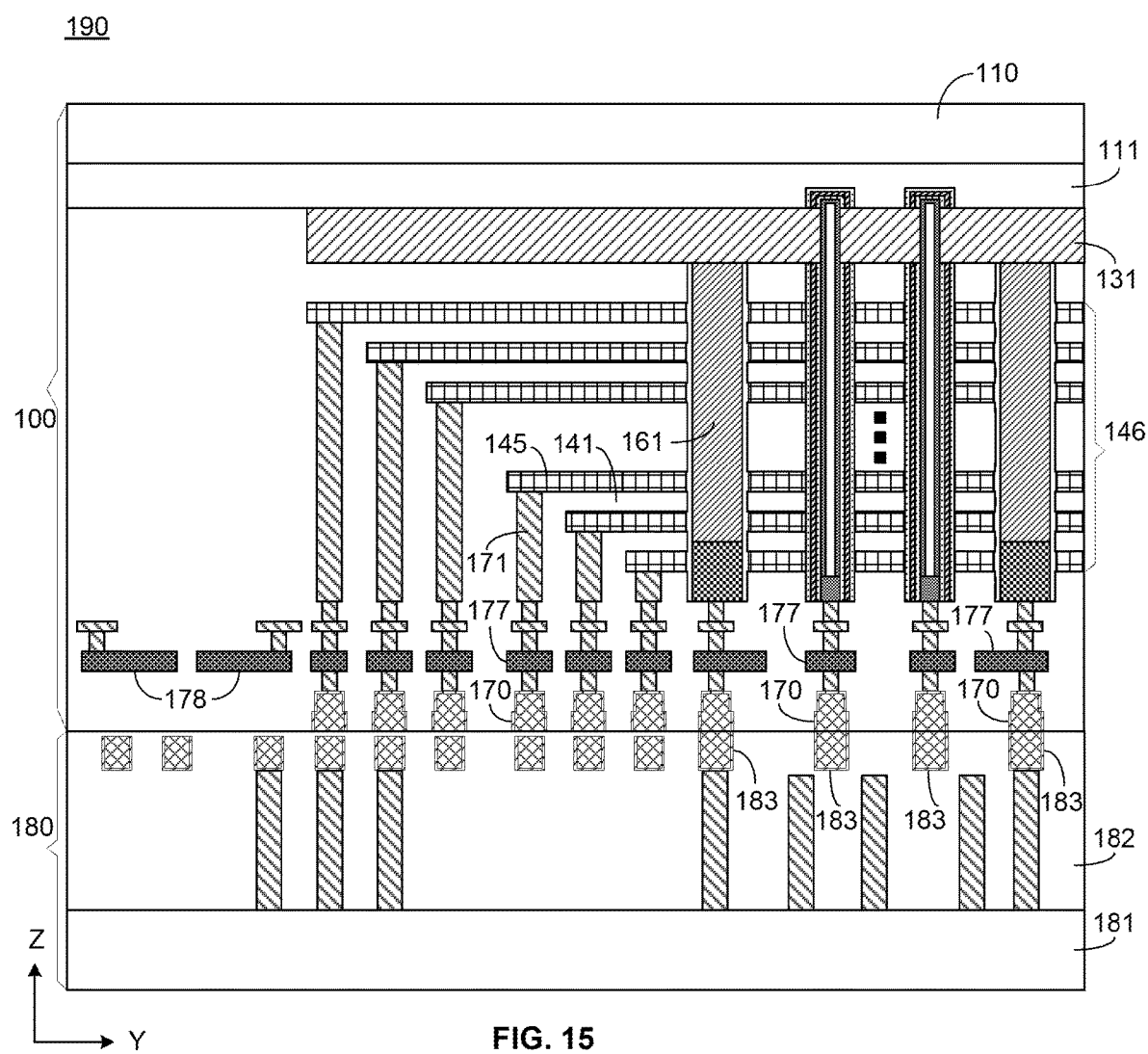
FIG. 15 illustrates a cross-sectional view of an exemplary 3D memory device after the 3D array device shown in FIG. 13 is bonded with the peripheral device shown in FIG. 14 according to various embodiments of the present disclosure.
Figure 16:
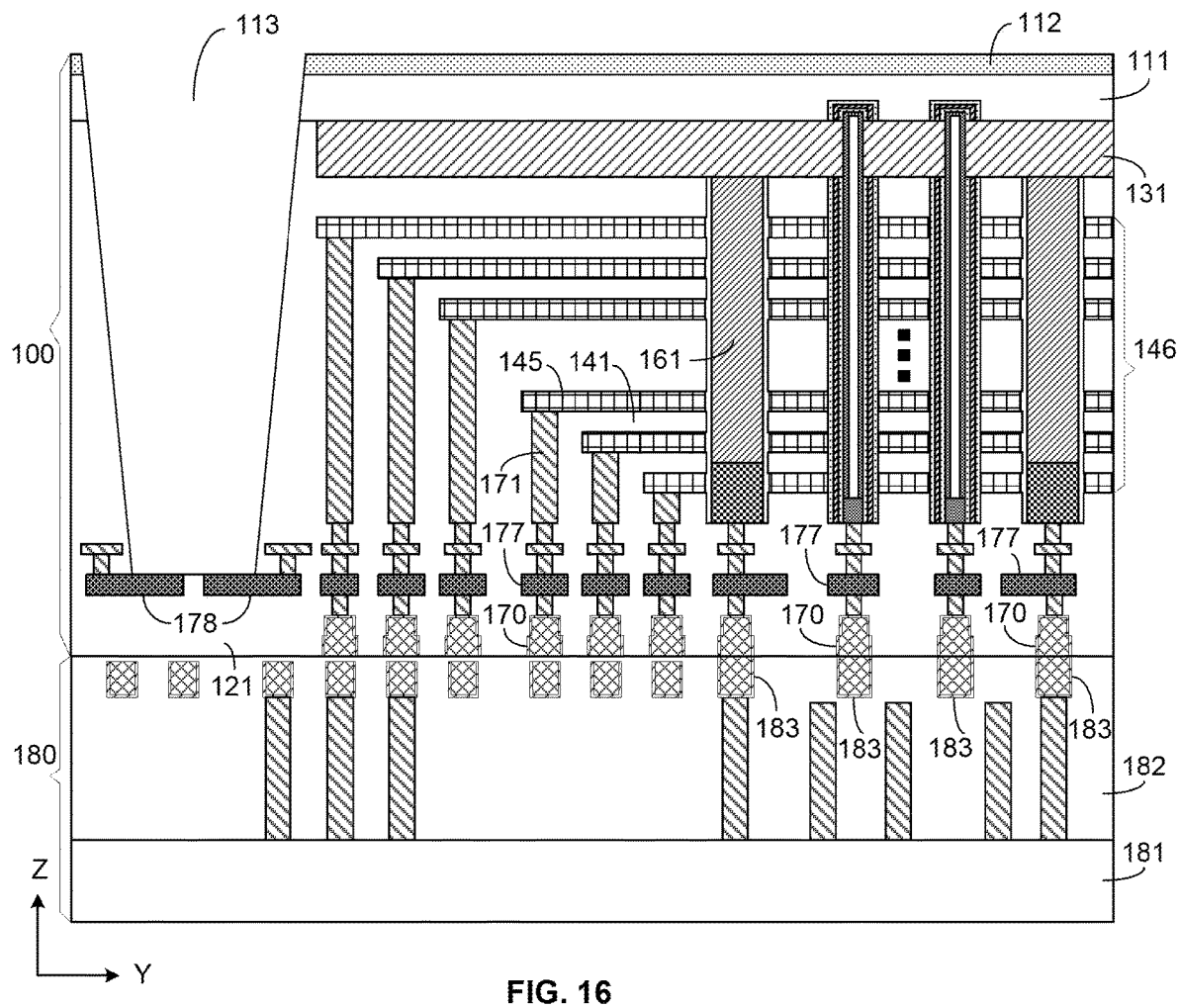
FIGS. 16 and 17 illustrate cross-sectional views of the 3D memory device shown in FIG. 15 at certain stages according to various embodiments of the present disclosure.
Figure 17:
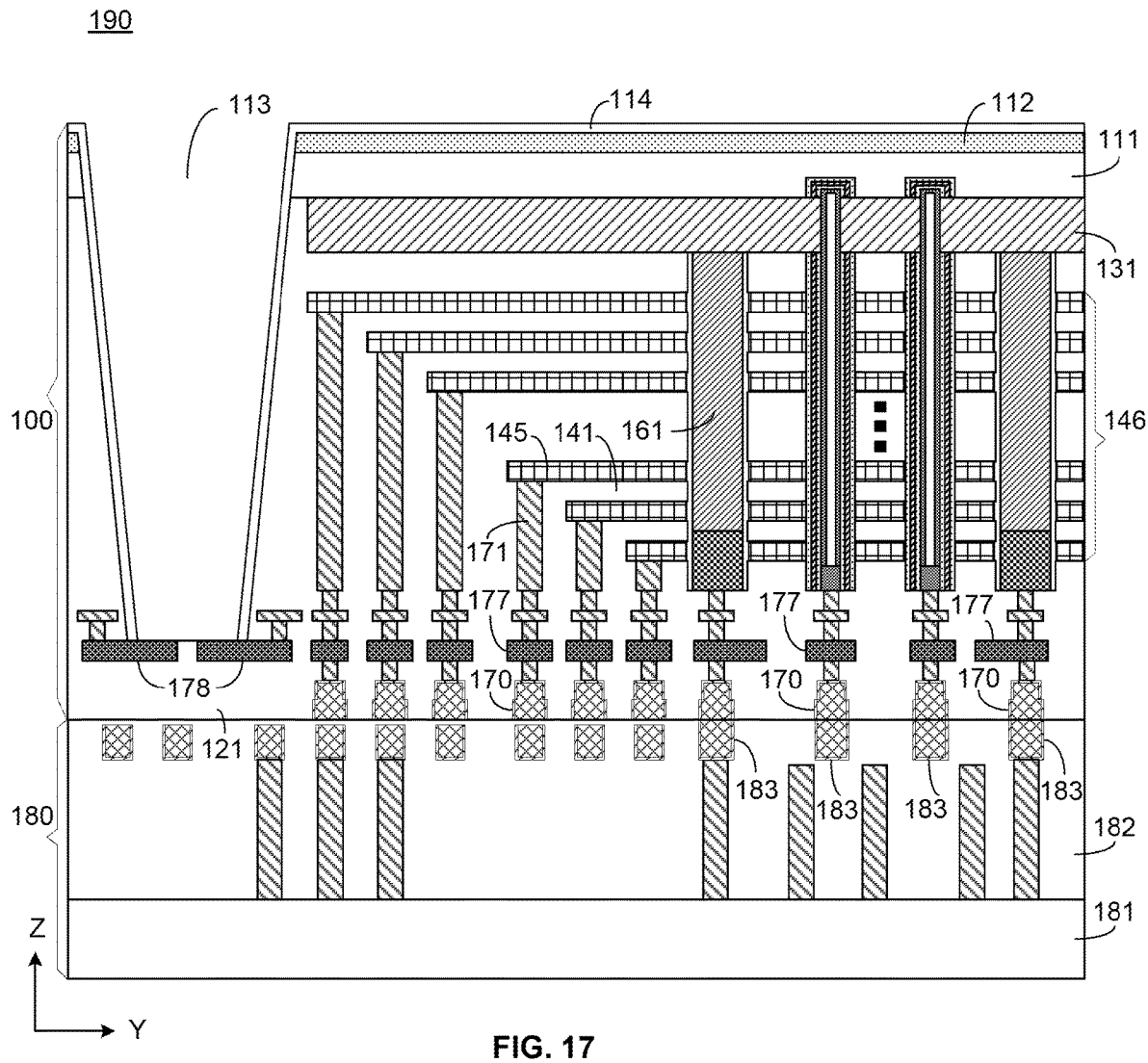

FIGS. 15-17 schematically show fabrication processes of an exemplary 3D memory device 190 according to embodiments of the present disclosure. The cross-sectional views of FIGS. 15-17 are in a Y-Z plane. The 3D memory device 190 may include the 3D array device 100 shown in FIG. 13 and the peripheral device 180 shown in FIG. 14. The peripheral device 180 is configured to control the array device 100.

The 3D array device 100 and peripheral device 180 may be bonded by a flip-chip bonding method to form the 3D memory device 190, as shown in FIG. 15. In some embodiments, the 3D array device 100 may be flipped vertically and become upside down with the top surfaces of the connecting pads 170 facing downward in the Z direction. The two devices may be placed together such that the 3D array device 100 is above the peripheral device 180. After an alignment is made, e.g., the connecting pads 170 may be aligned with the connecting pads 183, respectively, the 3D array device 100 and peripheral device 180 may be joined and bonded together. The layer stack 146 and the peripheral CMOS circuits become sandwiched between the substrates 110 and 181 or between the doped region 111 and the substrate 181. In some embodiments, a solder or an electrically conductive adhesive may be used to bond the connecting pads 170 with the connecting pads 183, respectively. As such, the connecting pads 170 are electrically connected to the connecting pads 183, respectively. The 3D array device 100 and peripheral device 180 are in electrical communication after the flip-chip bonding process is completed. For example, the contact pads 178 may be electrically connected to the peripheral device 180 through the connecting pads 170 and 183.

For the 3D array device 100 and peripheral device 180, the bottom side of the substrate 110 or 181 may be referred to as the back side, and the side with the connecting pads 170 or 183 may be referred to as the front side or face side. After the flip-chip bonding process, as shown in FIG. 15, the 3D array device 100 and peripheral device 180 are bonded face to face.

Thereafter, from the back side (after the flip-chip bonding), the substrate 110 of the 3D array device 100 may be thinned by a thinning process, such as wafer grinding, dry etch, wet etch, CMP, or a combination thereof. In some embodiments, the substrate 110 may be removed by the thinning process, which may expose the doped region 111. A dielectric layer 112 may be grown over the doped region 111 by a deposition process (e.g., a CVD or PVD process). An opening 113 may be formed by a dry etch process or a combination of dry etch and wet etch processes. The opening 113 may penetrate through the dielectric layer 112, the doped region 111, and the dielectric layer 121, and expose the metal layers 178, as shown in FIG. 16. The exposed metal layers 178, which are proximate to the peripheral device 180 vertically and beside the staircase structure and the layer stack 146, may be used as the contact pads for the 3D memory device 190. For example, bonding wires may be bonded on the metal layers 178 that may connect the 3D memory device 190 with other devices. As shown in FIG. 16, the staircase structure may be exemplarily between the metal layers 178 and the layer stack 146. As described above, the metal layers 177 and 178 may be formed with the same conductive material on the same level simultaneously. Thus, the metal layers 177 and 178 are approximately on the same level with respect to the doped region 111, the connecting pads 183, or the peripheral device 180 after the bonding process. In the vertical direction, the metal layers 177 are between the layer stack 146 and the connecting pads 183, the peripheral CMOS circuits, or the peripheral device 180.

Further, a dielectric material may be deposited to form a dielectric layer 114 above the dielectric layer 112 and on the sidewall and bottom of the opening 113. The dielectric layer 114 may serve as a passivation layer that may include a material such as silicon oxide, silicon nitride, silicon oxynitride, tetraethyl orthosilicate (TEOS), or a combination thereof. The dielectric layer 114 may be formed by a deposition process such as CVD or PVD. Next, a dry etch process or dry and wet etch processes may be performed to remove a portion of the dielectric layer 114 at the bottom of the opening 113, as shown in FIG. 17. The metal layers 178 become exposed again to become the contact pads or a part of the contact pads of the 3D memory device 190.

The dielectric layer 112 and 114 together may be considered as a top insulating layer. As shown in FIG. 17, the layer stack 146 and the NAND memory cells may be disposed between a portion (e.g., a first portion) of the top insulating layer and the peripheral device 180, and the metal layers 178 may be disposed between another portion (e.g., a second portion) of the top insulating layer and the peripheral device 180. The opening 113 is formed through the second portion of the top insulating layer and exposes the metal layers 178 disposed at the bottom of the opening 113 from the back side of the array device 100. The metal layer 178 and the bottom of the opening 113 may be disposed at a level between the top insulating layer and the peripheral device 180. Further, the metal layer 178 may be disposed at a level between the NAND memory cells and the peripheral device 180.

Thereafter, other fabrication steps or processes may be performed to complete fabrication of the 3D memory device 190. Details of the other fabrication steps or processes are omitted for simplicity.

If the contact pads of the 3D memory device 190 are formed after the 3D array device 100 and the peripheral device 180 are bonded together, because plasma processing is used several times during the formation of the contact pads, PID can occur to the peripheral CMOS circuits of the peripheral device 180 and cause yield and reliability issues. As shown in FIGS. 15-17, the metal layers 178 become the contact pads of the 3D memory device 190 after the flip-chip boding process. That is, some plasma processing steps are performed during the fabrication of the 3D array device 100, instead of after the 3D array device 100 and the peripheral device 180 are bonded together. Because the formation of the contact pads are implemented before the flip-chip bonding process, the peripheral device 180 may experience fewer plasma processing steps after being bonded with the 3D array device 100, and thus less PID may occur to the peripheral CMOS circuits. Hence, fabrication of the metal layers 178 may reduce the effects of PID and improve the yield and reliability of the 3D memory device 190.

Figure 18:
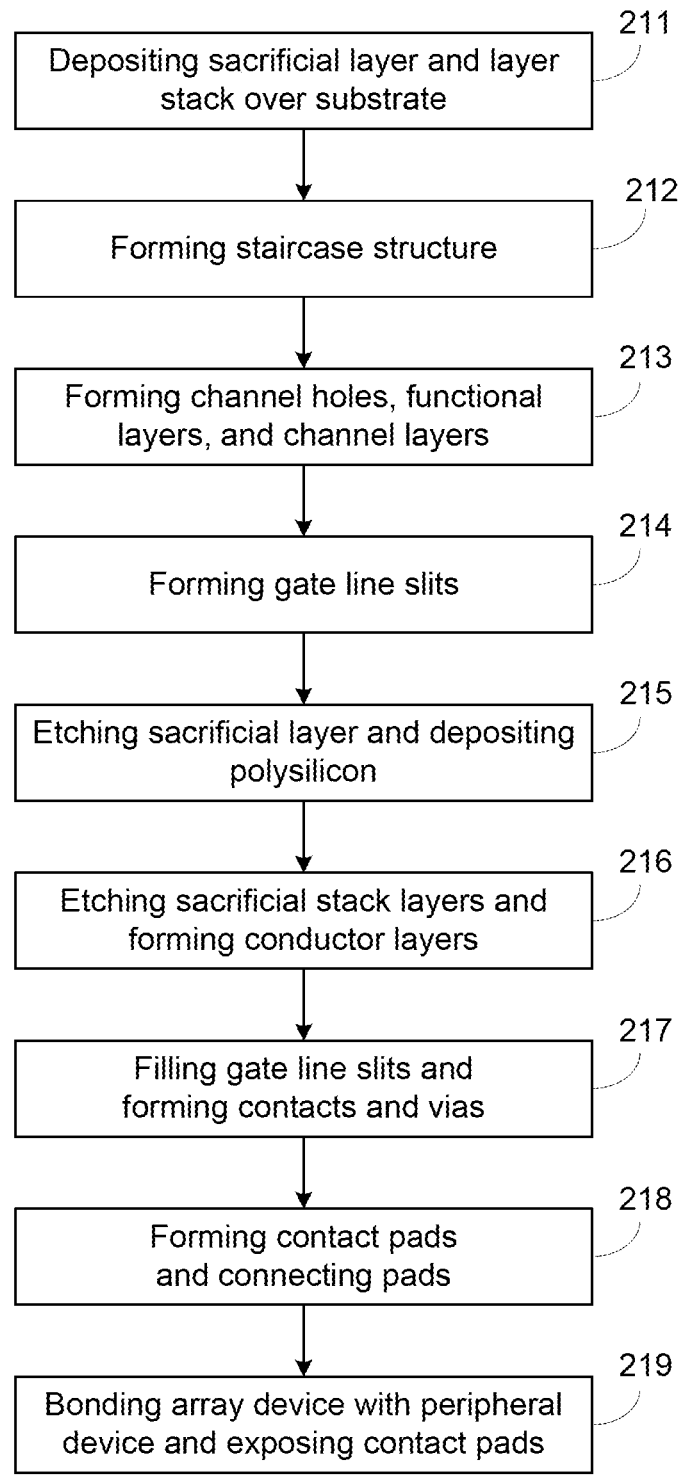
FIG. 18 illustrates a schematic flow chart of fabrication of a 3D memory device according to various embodiments of the present disclosure.

FIG. 18 shows a schematic flow chart 200 for fabricating a 3D memory device according to embodiments of the present disclosure. At 211, a sacrificial layer may be deposited over a top surface of a substrate for a 3D array device. The substrate may include a semiconductor substrate, such as a single crystalline silicon substrate. In some embodiments, a cover layer may be grown on the substrate before depositing the sacrificial layer. The cover layer may include a single layer or multiple layers that are grown sequentially over the substrate. For example, the cover layer may include silicon oxide, silicon nitride, and/or aluminum oxide. In some other embodiments, the sacrificial layer may be deposited without first depositing the cover layer over the substrate. The sacrificial layer may include single crystalline silicon, polysilicon, silicon oxide, or silicon nitride.

Over the sacrificial layer, a layer stack of the 3D array device may be formed. The layer stack may include a first stack layer and a second stack layer that are alternately stacked. The first stack layer may include a first dielectric layer and the second stack layer may include a second dielectric layer that is different than the first dielectric layer. In some embodiments, one of the first and second dielectric layers is used as a sacrificial stack layer.

At 212, a staircase formation process may be performed to convert a portion of the layer stack into a staircase structure. The staircase formation process may include multiple etches that are used to trim the portion of the layer stack into the staircase structure. A deposition process may be performed to deposit a dielectric layer to cover the staircase structure. A part of the dielectric layer on a side of the staircase structure may be used as a contact region where contact pads may be configured.

At 213, channel holes may be formed that extend through the layer stack and the sacrificial layer to expose portions of the substrate. A functional layer and a channel layer may be deposited on the sidewall and bottom surface of each channel hole. Forming the functional layer may include depositing a blocking layer on the sidewall of the channel hole, depositing a charge trap layer on the blocking layer, and depositing a tunnel insulation layer on the charge trap layer. The channel layer, deposited on the tunnel insulation layer, functions as a semiconductor channel and may include a polysilicon layer.

At 214, gate line slits of the 3D array device may be formed. Along the vertical direction, the gate line slits may extend through the layer stack. After the gate line slits are etched, portions of the sacrificial layer are exposed.

At 215, the sacrificial layer may be etched away and a cavity may be created above the substrate. The cavity exposes a bottom portion of the blocking layer of the functional layer in the cavity. The cover layer is also exposed in the cavity, if it is deposited on the substrate. The layers of the functional layer exposed sequentially in the cavity, including the blocking layer, the charge trap layer, and the tunnel insulation layer, are etched away by, e.g., one or more selective etch processes, respectively. As a result, a portion of the functional layer that is close to the substrate may be removed in the cavity. The cover layer, if deposited, also may be etched away during the process to etch the portion of the functional layer or in another selective etch process. Hence, a potion of the substrate and portions of the channel layers are exposed in the cavity.

Thereafter, a deposition process may be performed to grow a semiconductor layer such as a polysilicon layer in the cavity. The semiconductor layer electrically contacts the channel layers and the substrate.

In some embodiments, the layer stack may include two dielectric stack layers and one of the stack layers is sacrificial. The sacrificial stack layers may be etched away at 216 to leave cavities, which then may be filled with an electrically conductive material to form the conductor layers. The electrically conductive material may include a metal such as W, Co, Cu, Al, Ti, or Ta.

At 217, a dielectric layer such as an oxide layer may be deposited on the side walls and bottom surfaces of the gate line slits. Portions of the dielectric layer on the bottom surfaces may be etched out selectively to expose the semiconductor layer. Electrically conductive materials, such as TiN, W, Cu, Al, and/or doped polysilicon may be deposited in the gate line slits to form an array common source that electrically contacts the semiconductor layer. Further, etching and deposition processes may be performed to form word line contacts, first metal layers for interconnect, and vias.

At 218, a conductive material such as W, Co, Cu, Al, or a combination thereof may be deposited to form second metal layers. Some second metal layers may be used as the contact pads and some other second metal layers may be used for interconnect. The second metal layers may be covered by a dielectric layer. Further, etching and deposition processes may be performed to form vias and connecting pads. The connecting pads are configured for connection between the 3D array device and a peripheral device.

At 219, a flip-chip bonding process may be performed to bond the 3D array device and the peripheral device or fasten the 3D array device with the peripheral device to create a 3D memory device. In some embodiments, the 3D array device may be flipped upside down and positioned above the peripheral device. The connecting pads of the 3D array device and the peripheral device may be aligned and then bonded. The substrate of the 3D array device may be thinned. An etch process may be performed to expose the second metal layers that are configured as the contact pads in the contact region. The contact pads may be used to connect the 3D memory device with another device.

FIGS. 19-23 schematically show a fabrication process of an exemplary 3D array device 300 according to embodiments of the present disclosure. Among FIGS. 19-23, the cross-sectional views are in a Y-Z plane.

Figure 19:
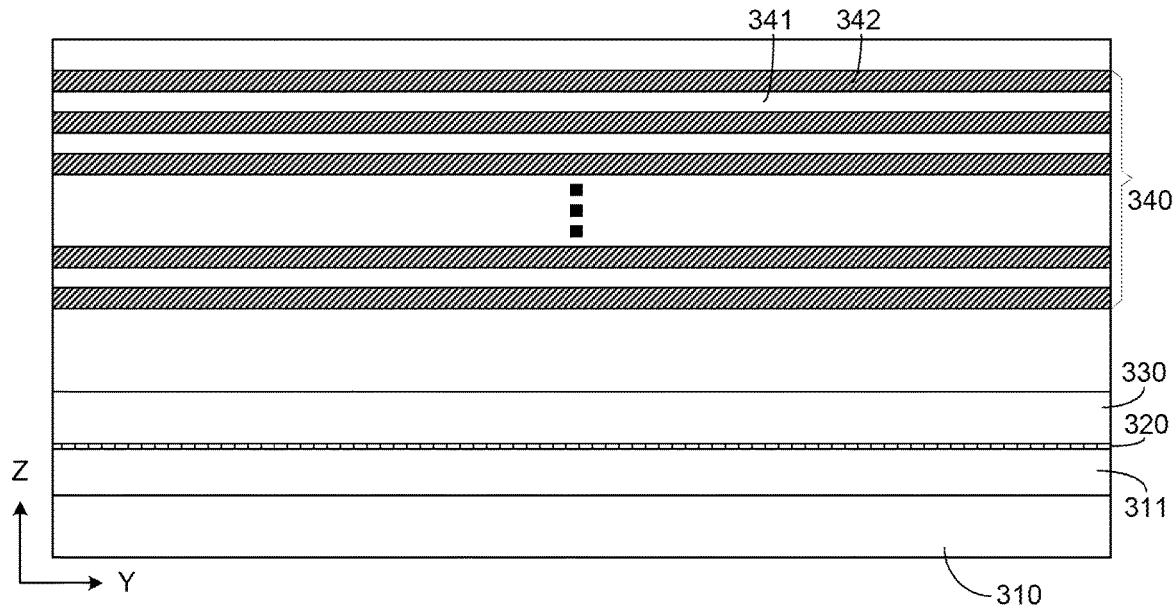
FIGS. 19 and 20 illustrate cross-sectional views of an exemplary 3D array device at certain stages during a fabrication process according to various embodiments of the present disclosure.

As shown in FIG. 19, the 3D array device 300 may include a substrate 310. The substrate 310 may include a single crystalline silicon layer, or may include another semiconductor material such as Ge, SiGe, SiC, SOI, GOI, polysilicon, GaAs, or InP. In the following descriptions, as an example, the substrate 310 includes an undoped or lightly doped single crystalline silicon layer.

In some embodiments, a top portion of the substrate 310 may be doped by n-type dopants to form a doped region 311. As shown in FIG. 19, a cover layer 320 may be deposited over the doped region 311. The cover layer 320 is a sacrificial layer and may include a single layer or multiple layers. For example, the cover layer 320 may include one or more of silicon oxide layer and silicon nitride layer. The cover layer 320 may be deposited by CVD, PVD, ALD, or a combination thereof. Alternatively, the cover layer 320 may include another material such as aluminum oxide.

Over the cover layer 320, a sacrificial layer 330 may be deposited. The sacrificial layer 330 may include a semiconductor material or dielectric material. In descriptions bellow, as an example, the sacrificial layer 330 is a polysilicon layer. After the sacrificial layer 330 is made, a layer stack 340 may be formed. The layer stack 340 includes multiple pairs of stack layers 341 and 342, i.e., the stack layers 341 and 342 are stacked alternately.

In some embodiments, the stack layers 341 and 342 may include a first dielectric layer and a second dielectric layer that is different from the first dielectric layer. The alternating stack layers 341 and 342 may be deposited via CVD, PVD, ALD, or any combination thereof. In descriptions bellow, materials for the stack layers 341 and 342 (i.e., the first and second dielectric layers) are silicon oxide and silicon nitride, respectively. The silicon oxide layer may be used as an isolation stack layer and the silicon nitride layer may be used as a sacrificial stack layer.

Figure 20:
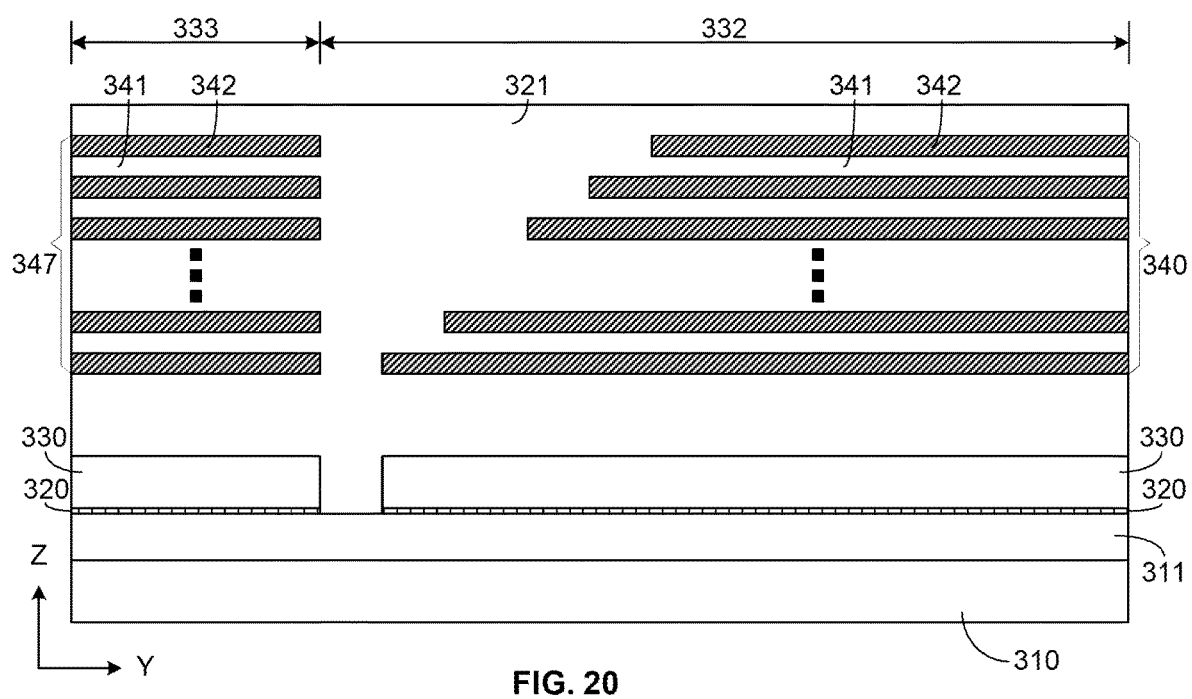

Further, a staircase formation process may be performed to trim a part of the layer stack 340 into a staircase structure in a channel hole region 332. The staircase structure may be covered by a dielectric material such as silicon oxide that forms a dielectric layer 321. During the staircase formation process, the stack layers 341 and 342, the cover layer 320, and the sacrificial layer 330 in a contact region 333 may remain unchanged. The contact region 333 may be configured for contact pads. The stack layers 341 and 342 in the contact region 333 may form a layer stack 347 over the remaining sacrificial layer 330 and the remaining cover layer 320, as shown in FIG. 20. The layer stack 347 contains the stack layers 341 and 342, i.e., the alternating first and second dielectric layers. Horizontally, the layer stack 347 may be on a side of the staircase structure, e.g., on the left side of the staircase structure, and the staircase structure may be between the layer stacks 340 and 347. The staircase structure and the layer stack 347 may be separated by a portion of the dielectric layer 321 that is deposited over the doped region 311.

Figure 21:
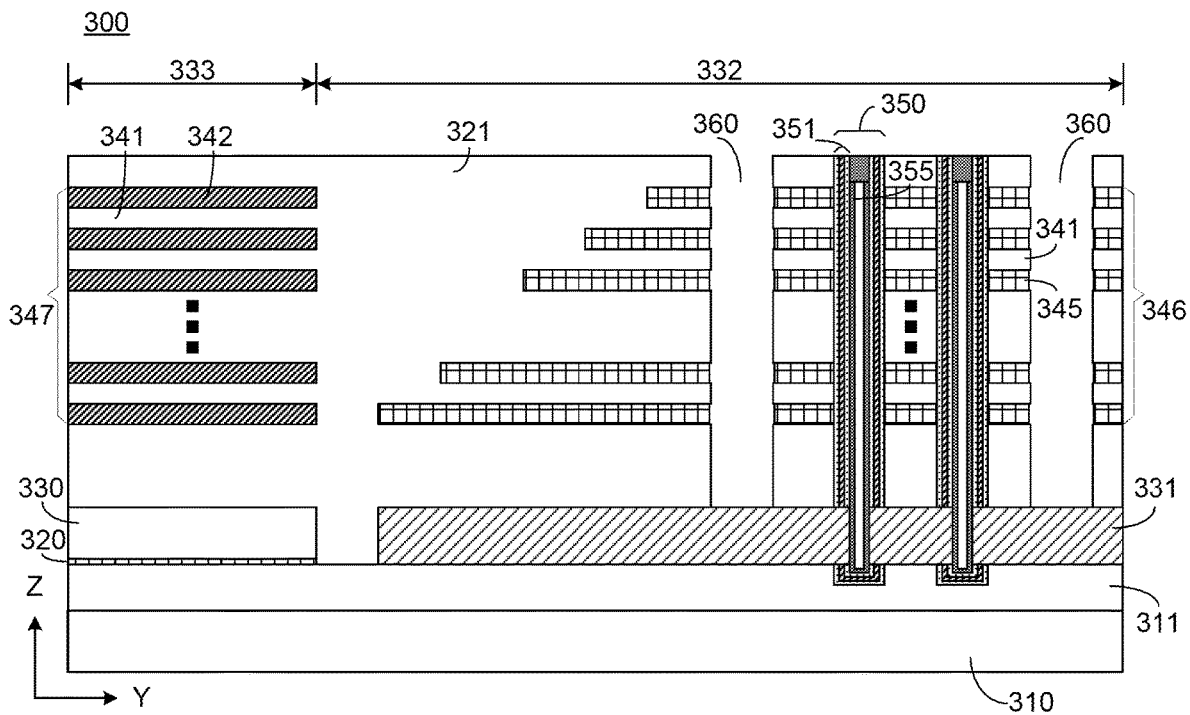
FIGS. 21, 22, and 23 illustrate cross-sectional views of the 3D array device shown in FIG. 20 at certain stages in the fabrication process according to various embodiments of the present disclosure.
Figure 22:
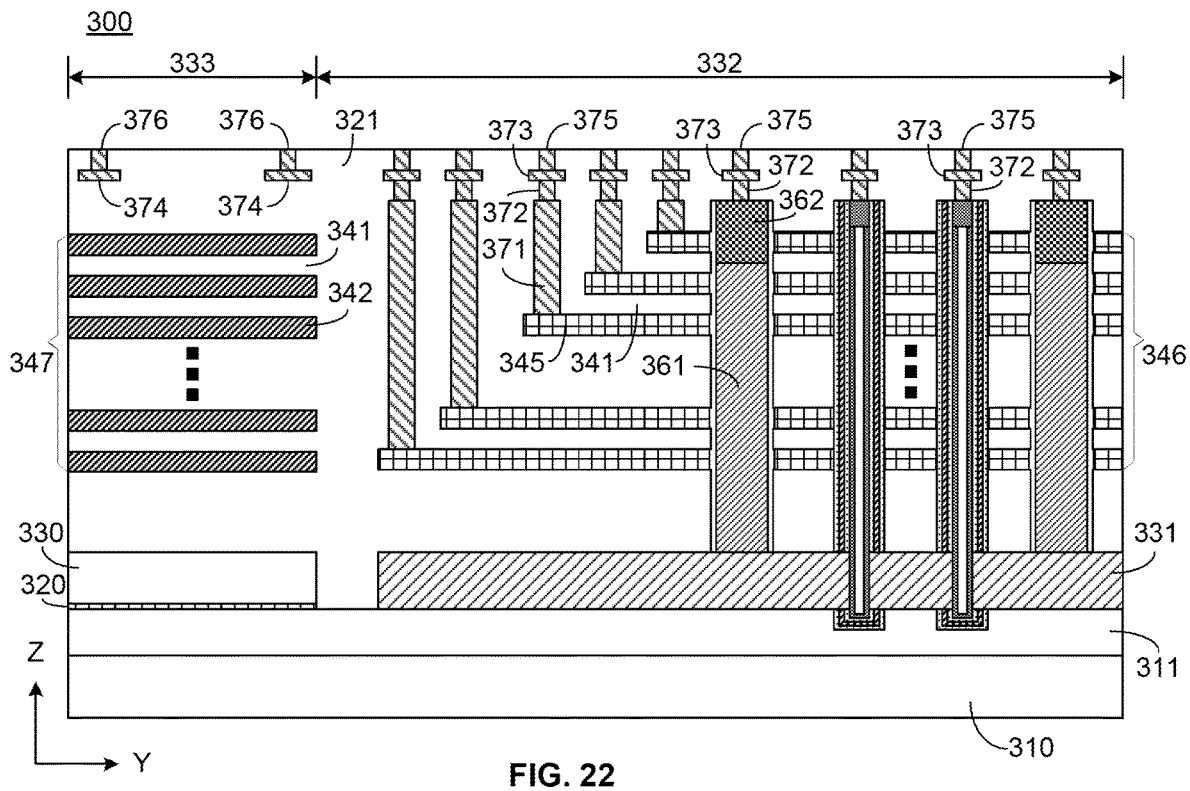
Figure 23:
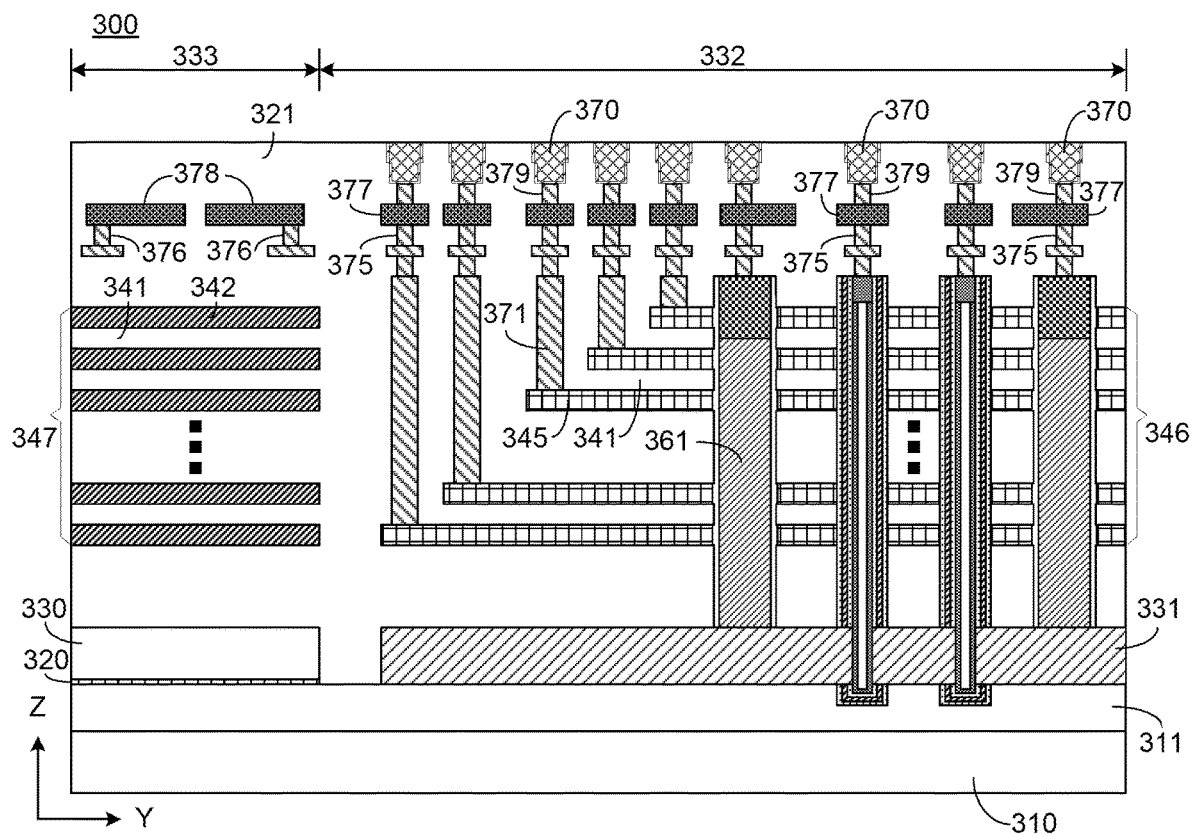

FIGS. 21, 22, and 23 show schematic cross-sectional views of the 3D array device 300 at certain stages according to embodiments of the present disclosure. After the layer stack 340 is made, channel holes 350 may be formed. The quantity, dimension, and arrangement of the channel hole 350 shown in FIGS. 21-23 are exemplary and for description of structures and fabrication methods.

The channel holes 350 may have a cylinder shape or pillar shape that extends through the layer stack 340, the sacrificial layer 330, and the cover layer 320, and partially penetrates the doped region 311. After the channel holes 350 are formed, a functional layer 351 may be deposited on the sidewall and bottom of the channel hole. The functional layer 351 may include a blocking layer on the sidewall and bottom of the channel hole, a charge trap layer on a surface of the blocking layer, and a tunnel insulation layer on a surface of the charge trap layer.

In some embodiments, the functional layer 351 may include the ONO structure, which is used in descriptions below. For example, a silicon oxide layer may be deposited on the sidewall of the channel hole 350 as the blocking layer. A silicon nitride layer may be deposited on the blocking layer as the charge trap layer. Another silicon oxide layer may be deposited on the charge trap layer as the tunnel insulation layer. On the tunnel insulation layer, a polysilicon layer may be deposited as a channel layer 355. Like the channel holes, the channel layer 355 may also extend through the layer stack 340 and into the doped region 311. The channel holes 350 may be filled by an oxide material after the channel layers 355 are formed. The channel hole 350 may be sealed by a plug that may include an electrically conductive material (e.g., metal W) and electrically contact the channel layer 355.

Further, gate line slits 360 may be formed by a dry etch process or a combination of dry and wet etch processes. The gate line slits 360 may extend through the layer stack 340 and reach or partially penetrate the sacrificial layer 330 in the Z direction. As such, at the bottom of the gate line slits 360, parts of the sacrificial layer 330 are exposed. Spacer layers (not shown) may be deposited on the sidewall and bottom of the gate line slit 360, and portions of the spacer layers at the bottom of the slits 360 may be removed by etch to expose the sacrificial layer 330 again. The sacrificial layer 330 may be etched out. Removal of the sacrificial layer 330 creates a cavity and exposes the cover layer 320 and bottom portions of the blocking layers formed in the channel holes 350. Portions of the blocking layer, the charge trap layer, and the tunnel insulation layer may be etched away, exposing bottom potions of the channel layer 355. The cover layer 320 may be removed when the bottom portions of the functional layer 351 are etched away or in an additional selective etch process, exposing a top surface of the doped region 311.

The cavity may be filled by a semiconductor material, e.g., polysilicon, to form a semiconductor layer 331. The semiconductor layer 331 may be deposited on surfaces of the exposed portions of the doped region 311 and the channel layer 355. Further, the sacrificial stack layers 342 may be removed by etch and replaced by conductor layers 345 that include an electrically conductive material such as W. The layer stack 340 becomes a layer stack 346 after the conductor layers 345 are formed, as shown in FIG. 21.

Each conductor layer 345 is configured to electrically connect one or more rows of NAND memory cells along the Y direction or in the X-Y plane and is configured as a word line for the 3D array device 300. The channel layer 355 formed in the channel hole 350 is configured to electrically connect a NAND string along the Z direction and configured as a bit line for the 3D array device 300.

The gate line slits 360 may be filled with a conductive material 361 (e.g., doped polysilicon) and a conductive plug 362 (e.g., with a conductive material W), as shown in FIG. 22. In some embodiments, the filled gate line slits may become an array common source for the 3D array device 300.

Thereafter, openings for word line contacts 371 may be formed. The openings are filled with a conductive material (e.g., W, Co, Cu, Al, or any combination thereof) to form the contacts 371. Further, a CVD or PVD process may be performed to deposit a dielectric material (e.g., silicon oxide or silicon nitride) on the 3D array device 300. The dielectric layer 321 becomes thicker. Further, openings for vias 372 may be formed and subsequently filled with a conductive material such as W, Co, Cu, or Al. Some vias 372 are electrically connected to the word line contacts 371. Some vias 372 are electrically connected to the plugs 362 and the upper ends of corresponding NAND strings.

Further, metal layers 373 and 374 for interconnect may be deposited. The metal layers 373 electrically contact the vias 372, respectively. The metal layers 374 are in the contact region 333 and configured for interconnect with the contact pads. The metal layers 373 and 374 may include a conductive material such as W, Co, Cu, Al, or a combination thereof.

Further, the metal layers 373 and 374 may be covered by a dielectric material that makes the dielectric layer 321 thicker. Similar to the formation of the vias 372, vias 375 and 376 may be made over and contacting the metal layers 373 and 374, respectively, as shown in FIG. 22.

Further, CVD, PVD, ALD, electroplating, electroless plating, or a combination thereof may be performed to grow metal layers 377 and 378 over the vias 375 and 376, respectively. The metal layer 377 and 378 may be formed with the same material simultaneously, and disposed approximately on the same level with respect to the layer stacks 346 and 347, the doped region 311, or the substrate 310. The metal layer 377 and 378 may include a conductive material such as W, Co, Cu, Al, or any combination thereof. The metal layers 377 may be electrically connected to the layer stack 346 or the NAND memory cells through the metal layers 373 and vias 372 and 375. The metal layers 378 are configured as the contact pads, and may be connected to the metal layers 374 through the vias 376. The metal layers 378 may be disposed over a dielectric region including a part of the dielectric layer 321 and the layer stack 347.

Further, a CVD or PVD process may be performed again to deposit a dielectric material to cover the metal layers 377 and 378 and thicken the dielectric layer 321. Similar to the formation of the vias 372 and 375, openings may be formed and then filled by a conductive material to form vias 379 over and contacting the metal layers 377. Further, a dielectric material may be deposited to cover the vias 379 and further thicken the dielectric layer 321. Openings are made and then filled to form connecting pads 370 that serve for connecting with a peripheral device. The connecting pads 370 electrically contact the vias 379, respectively, as shown in FIG. 23. The connecting pads 370 may include W, Co, Cu, Al, or a combination thereof.

Figure 24:
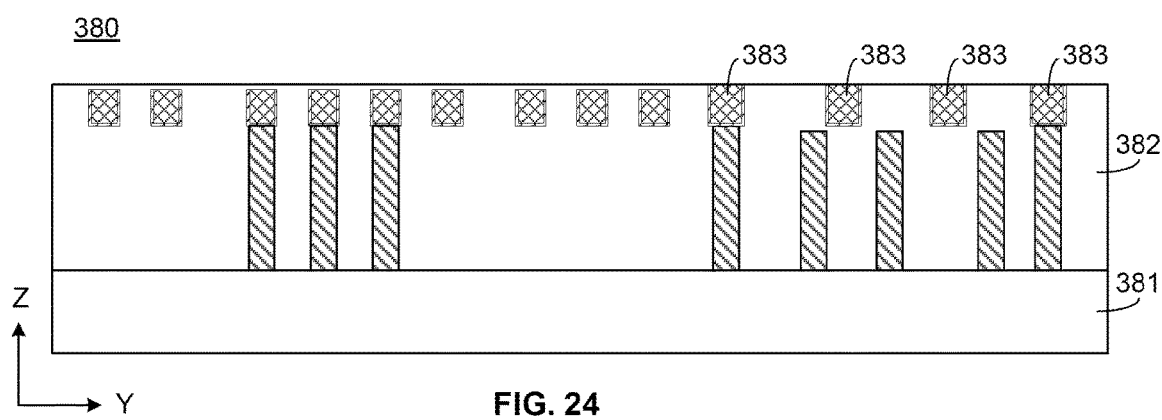
FIG. 24 illustrates a cross-sectional view of an exemplary peripheral device according to various embodiments of the present disclosure.

FIG. 24 schematically shows a peripheral device 380 in a cross-sectional view according to embodiments of the present disclosure. The peripheral device 380 may include a semiconductor substrate 381 (e.g., a substrate of single crystalline silicon). Peripheral CMOS circuits (e.g., control circuits) (not shown) may be fabricated on the substrate 381 and used for facilitating the operation of the 3D array device 300. A dielectric layer 382 including one or more dielectric materials may be deposited over the substrate 381. Connecting pads such as connecting pads 383 and vias may be formed in the dielectric layer 382. The connecting pads 383 are configured for connecting with the 3D array device 300 and may include an electrically conductive material (e.g., W, Co, Cu, Al, or any combination thereof).

Figure 25:
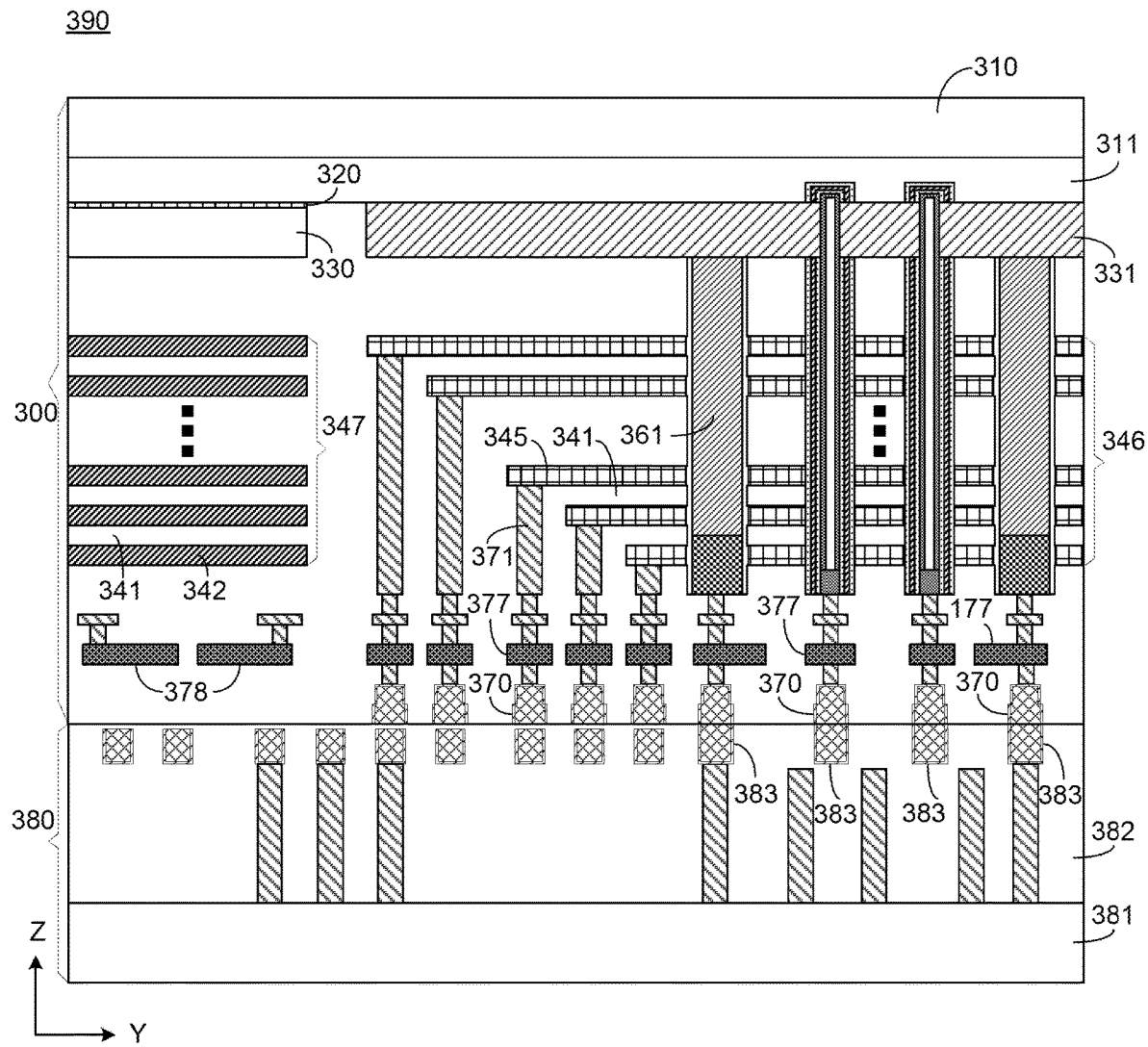
FIG. 25 illustrates a cross-sectional view of an exemplary 3D memory device after the 3D array device shown in FIG. 23 is bonded with the peripheral device shown in FIG. 24 according to various embodiments of the present disclosure.
Figure 26:
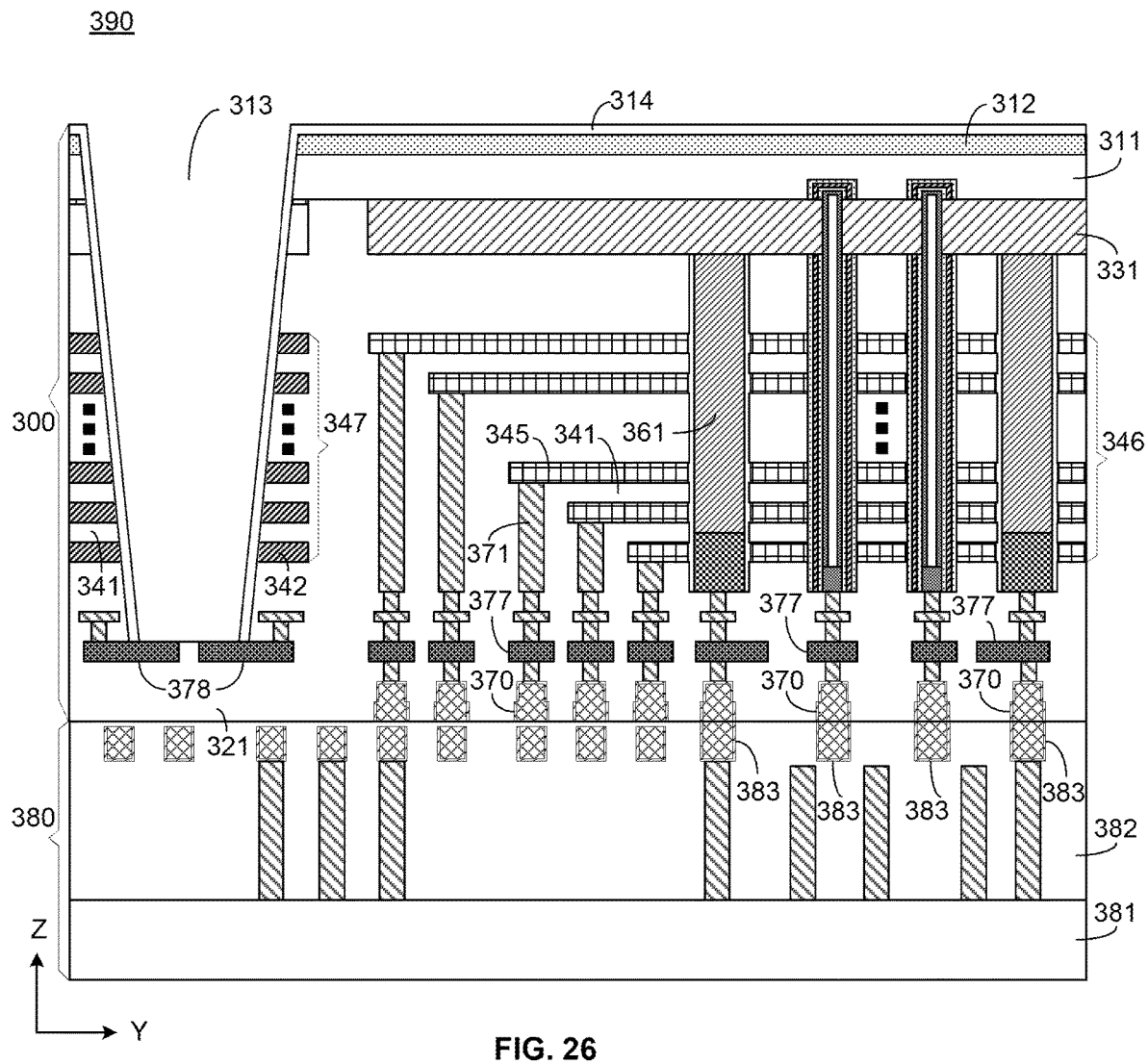
FIG. 26 illustrates a cross-sectional view of the 3D memory device shown in FIG. 25 at a certain stage according to various embodiments of the present disclosure.

FIGS. 25 and 26 show schematic fabrication processes of an exemplary 3D memory device 390 according to embodiments of the present disclosure. The cross-sectional views of FIGS. 25-26 are in a Y-Z plane. The 3D memory device 390 is formed by bonding the 3D array device 300 and peripheral device 380 in a flip-chip bonding process. In some embodiments, the 3D array device 300 may be flipped vertically and become upside down with the top surfaces of the connecting pads 370 facing downward in the Z direction. The 3D array device 300 may be placed above and aligned with the peripheral device 380. For example, the connecting pads 370 may be aligned with the connecting pads 383, respectively. Then, the 3D array device 300 and peripheral device 380 may be joined and bonded together face to face, as shown in FIG. 25. The connecting pads 370 are electrically connected to the connecting pads 383, respectively. As such, the metal layers 378 may be electrically connected to the peripheral device 380 through the connecting pads 370 and 383.

Thereafter, the substrate 310 of the 3D array device 300 may be thinned and a dielectric layer 312 may be grown over the doped region 311 by a deposition process. An opening 313 may be formed by a dry etch process or a combination of dry etch and wet etch processes. The opening 313 penetrates through the dielectric layer 312, the doped region 311, the remaining cover layer 320, the remaining sacrificial layer 330, the layer stack 347, and the dielectric layer 321 to expose the metal layers 378. After the opening 313 is made, a portion of the layer stack 347 is removed by etch. The remaining portion of the layer stack 347 may still be considered as a layer stack that contains the alternating first and second dielectric layers (i.e., the stack layers 341 and 342). In some embodiments, the opening 313 may be completely surrounded by the remaining layer stack 347 in an X-Y plane. Optionally, the opening 313 may be partially surrounded by the remaining layer stack 347 in an X-Y plane. For example, in the latter scenario, a part of the opening 313 may go through the layer stack 347 and another part of the opening 313 may go through the dielectric region 321 in the X-Y plane. In a vertical direction (e.g., the Z direction), the metal layers 378 are below the remaining layer stack 347, or between the remaining layer stack 347 and the peripheral device 380. Further, a dielectric layer 314 may be formed as a passivation layer on the dielectric layer 312 and the sidewall of the opening 313.

The exposed metal layers 378, which are beside the staircase structure and the layer stack 346, may be used as the contact pads for the 3D memory device 390. For example, bonding wires may be bonded on the metal layers 378 for connection with another device. As described above, the metal layers 377 and metal layers 378 (i.e., the contact pads) are formed with the same material at the same time. After the flip-chip bonding process, the metal layers 377 are between the layer stack 346 and the peripheral device 380, or between the layer stack 346 and the connecting pads 383. The metal layers 377 and 378 are approximately disposed on the same level with respect to the layer stacks 346 and 347, the doped region 311, the connecting pads 383, or the peripheral device 380.

Thereafter, other fabrication steps or processes may be performed to complete fabrication of the 3D memory device 390. Details of the other fabrication steps or processes are omitted for simplicity.

Since the contact pads (i.e., the metal layers 378) are formed before the flip-chip bonding process, the peripheral device 380 may experience fewer plasma processing steps after being bonded with the 3D array device 300. Hence, less PID may occur to the peripheral CMOS circuits. The effects of PID may be reduced and the yield and reliability of the 3D memory device 390 may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
    providing a substrate for the 3D memory device;
    forming a plurality of memory cells of the 3D memory device over a first portion of a face side of the substrate;
    depositing a first dielectric layer to cover the plurality of memory cells and the substrate;
    forming at least one contact pad over a second portion of the face side of the substrate;
    depositing a second dielectric layer over the at least one contact pad and the first dielectric layer;
    forming a plurality of first connecting pads over the second dielectric layer and connected to the at least one contact pad and the plurality of memory cells;
    bonding the plurality of first connecting pads with a plurality of second connecting pads of a peripheral structure;
    forming an opening through the substrate and the first dielectric layer, thereby exposing the at least one contact pad from a back side of the substrate; and
    forming a layer stack between the second portion of the face side of the substrate and the at least one contact pad, wherein the layer stack includes dielectric layers alternately stacked over one another and the opening passes through the layer stack.

2. The method according to claim 1, wherein forming the plurality of memory cells of the 3D memory device includes:
    forming another layer stack including a plurality of first dielectric stack layers and a plurality of conductive stack layers alternately stacked over each other; and
    forming the plurality of memory cells through the another layer stack.

3. The method according to claim 2, wherein forming the plurality of memory cells through the another layer stack further includes:
    forming a plurality of channel structures extending through the another layer stack, wherein each of the channel structures comprises a functional layer and a channel layer, the functional layer being between the channel layer and the another layer stack.

4. The method according to claim 3, wherein forming the plurality of memory cells through the another layer stack further includes:
    forming a semiconductor layer disposed between the another layer stack and the substrate, the plurality of channel structures each extending into the semiconductor layer.

5. The method according to claim 4, wherein:
    the semiconductor layer comprises one or more doped layers.

6. The method according to claim 1, further comprising:
    forming a plurality of conductive layers for interconnect over the first dielectric layer.

7. The method according to claim 6, wherein:
    the at least one contact pad and the plurality of conductive layers comprise a same material and are disposed at a same level with respect to the substrate.

8. The method according to claim 1, wherein exposing the at least one contact pad further includes:
    thinning or removing the substrate before forming the opening to expose the at least one contact pad.

9. A three-dimensional (3D) memory device, comprising:
    an array device and a peripheral device bonded face to face;
    the array device including an insulating layer, one or more contact pads, and a plurality of memory cells between a first portion of the insulating layer and the peripheral device;
    a layer stack between a second portion of the insulating layer and the one or more contact pads, wherein the layer stack includes dielectric layers alternately stacked over one another; and
    an opening formed through the second portion of the insulating layer and the layer stack, and exposing the one or more contact pads disposed at a bottom of the opening from a back side of the array device, the bottom of the opening disposed at a level between the insulating layer and the peripheral device.

10. The 3D memory device according to claim 9, further comprising:
    another layer stack including a plurality of first dielectric stack layers and a plurality of conductive stack layers alternately stacked over each other, wherein the plurality of memory cells comprise a plurality of channel structures and the plurality of conductive stack layers, each of the channel structures extending through the plurality of conductive stack layers.

11. The 3D memory device according to claim 10, wherein:
    each of the channel structures comprises a functional layer and a channel layer, the functional layer being between the channel layer and the another layer stack.

12. The 3D memory device according to claim 10, further comprising:
    a semiconductor layer disposed between the insulating layer and the another layer stack, the plurality of channel structures each extending into the semiconductor layer.

13. The 3D memory device according to claim 9, further comprising:
    a plurality of conductive layers between the insulating layer and the plurality of memory cells and connected to the plurality of memory cells.

14. The 3D memory device according to claim 13, wherein:
  the one or more contact pads and the plurality of conductive layers comprise a same material and are disposed at a same level with respect to the peripheral device.

15. The 3D memory device according to claim 11, wherein:
  the one or more contact pads are disposed at a level between the insulating layer and the peripheral device.

16. The 3D memory device according to claim 15, wherein:
  the one or more contact pads are disposed at a level between the plurality of memory cells and the peripheral device.

* * * * *